(12) United States Patent
Shinmoto et al.

(10) Patent No.: US 7,285,961 B2
(45) Date of Patent: Oct. 23, 2007

(54) INSULATION DEGRADATION DIAGNOSTIC DEVICE

(75) Inventors: Takashi Shinmoto, Tokyo (JP); Yuji Urabe, Sakura (JP); Tatsuya Murofushi, Sakura (JP); Tatsuya Ogawa, Tokyo (JP)

(73) Assignee: Fujikura Ltd., Tokyo (JP)

(*) Notice: Subject to any disclaimer, the term of this patent is extended or adjusted under 35 U.S.C. 154(b) by 0 days.

(21) Appl. No.: 10/576,451

(22) PCT Filed: Oct. 21, 2004

(86) PCT No.: PCT/JP2004/015631

§ 371 (c)(1),
(2), (4) Date: Apr. 20, 2006

(87) PCT Pub. No.: WO2005/038475

PCT Pub. Date: Apr. 28, 2005

(65) Prior Publication Data

US 2007/0085548 A1 Apr. 19, 2007

(30) Foreign Application Priority Data

Oct. 22, 2003 (JP) ............................. 2003-362135
Feb. 24, 2004 (JP) ............................. 2004-048148

(51) Int. Cl.
*G01R 31/02* (2006.01)
(52) U.S. Cl. ..................................... 324/541; 324/536
(58) Field of Classification Search ................ 324/536, 324/541, 525
See application file for complete search history.

(56) References Cited

U.S. PATENT DOCUMENTS 4,887,041 A * 12/1989 Mashikian et al. ......... 324/533
4,929,903 A * 5/1990 Saigo et al. ................ 324/544
5,469,067 A * 11/1995 Endoh et al. ............... 324/551
5,854,556 A * 12/1998 Steennis et al. ............ 324/541

(Continued)

FOREIGN PATENT DOCUMENTS

JP 58-5677 A 1/1983

(Continued)

*Primary Examiner*—Walter Benson
(74) *Attorney, Agent, or Firm*—Sughrue Mion Pllc.

(57) ABSTRACT

An insulation degradation diagnostic device (1a) comprises a current transformer (7a), a first amplifier (15), a first high-pass filter (17), a low-pass filter (19), a second amplifier (20), a second high-pass filter (21), and a discharge determining part (30). The current transformer (7a) has a filtering function, which has an attenuation amount of −60 dB or less and a slope characteristic of −5 dB/oct or less for commercial frequencies, and detects a current flowing through a grounding wire (5). The first amplifier (15) amplifies a current signal from the current transformer (7a). The first high-pass filter (17) eliminates low frequency component from the amplified current signal. The low-pass filter (19) eliminates high frequency components from the current signal from which the low frequency components have been eliminated. The second amplifier (20) amplifies the current signal from the low-pass filter (19) up to a predetermined level. The second high-pass filter (21) extracts, from the current signal as amplified by the second amplifier (20), a signal corresponding to a discharge current caused by a partial discharge. The discharge determining part (30) determines, based on the signal as extracted by the second high pass filter (21), whether the partial discharge has occurred in a cable (2).

13 Claims, 21 Drawing Sheets

U.S. PATENT DOCUMENTS 6,809,523 B1 * 10/2004 Ahmed et al. .............. 324/520

FOREIGN PATENT DOCUMENTS

| JP | 5-60827 A | 3/1993 |
| JP | 6-7146 B2 | 1/1994 |
| JP | 2000-2743 A | 1/2000 |
| JP | 2004-85479 A | 3/2004 |
| JP | 2004-347424 A | 12/2004 |

* cited by examiner

NOISE CURRENT

TIME

TIME

TIME

INSULATION DEGRADATION DIAGNOSTIC DEVICE

This application claims priority from PCT Application No. PCT/JP2004/015631 filed Oct. 21, 2004, from Japanese Patent Application No. 2003-362135filed Oct. 22, 2003, and from Japanese Patent Application No. 2004-048148 filed Feb. 24, 2004, which applications are incorporated herein by reference.

TECHNICAL FIELD

The present invention relates to a device for diagnosing insulation degradation of a high voltage power transmission apparatus (power cable etc.) connected to a high voltage system and, more particularly, to a diagnostic device for measuring partial discharge that has occurred within a high voltage power transmission apparatus based on discharge current flowing through a grounding conductor of the high voltage power transmission apparatus.

BACKGROUND ART

A method for diagnosing insulation degradation of a power cable is disclosed in Japanese Examined Patent Publication No. H 06-7146. The method diagnoses insulation degradation of a power cable using discharge current caused by a partial discharge. As shown in FIG. 1A, a diagnostic device 101 comprises a cable 102, an intermediate connecting section 103, terminal joints 104a and 104b, a high frequency blocking coil 105, a high voltage power source 106, a coupling capacitor 107, a detecting impedance 108, and a partial discharge measurement device 109. Here, FIG. 1A and FIG. 1B are a wiring diagram and an equivalent circuit diagram of the diagnostic device 101, respectively.

The cable 102 is configured by connecting two cables using the intermediate connecting section 103. Further, the cable 102 has a first end portion connected to a first end portion of the terminal joint 104a and a second end portion connected to a first end portion of the terminal joint 104b. The terminal joint 104a has a second end portion connected to the high voltage power source 106 via the high frequency blocking coil 105. The terminal joint 104b has a second end portion connected to the detecting impedance 108 via the coupling capacitor 107. The partial discharge measurement device 109 has both ends respectively connected to both ends of the detecting impedance 108 and detects a potential difference that is generated across both ends of the detecting impedance 108. A capacitor 102a in FIG. 1B has an electrostatic capacitance equal to the electrostatic capacitance of the cable 102.

Next, an insulation degradation diagnostic method of the diagnostic device 101 will be described. After the operation of the cable 102 is stopped, a test voltage is applied to the cable 102 from the high voltage power source 106. By this operation, a partial discharge occurs in an insulator of the cable 102 and discharge current is induced in a conductor of the cable 102. Incidentally, the discharge current has a high frequency pulse waveform. The discharge current is output to the detecting impedance 108 via the coupling capacitor 107. The partial discharge measurement device 109 detects a pulse voltage that is generated across both ends of the detecting impedance 108 and generates data. After performing predetermined processing to the generated data, the insulation degradation of the cable 102 is diagnosed.

The partial discharge measurement device 109 is, for example, a tuning type partial discharge measurement device. The partial discharge measurement device 109 comprises a tuning detector, a wide band attenuator, a tuning amplifier, a detector, etc. (none of them is shown). The tuning detector detects a pulse voltage as a waveform of constant frequency attenuation oscillation. The wide band attenuator attenuates an output waveform of the tuning detector to a proper level. The tuning amplifier tunes and amplifies the output waveform of the wide band attenuator at a tuning frequency with "400" kHz being as its center in order to avoid the radio broadcast band. The detector detects the output waveform of the tuning amplifier.

A method for diagnosing insulation degradation of a branch joint of a power distribution high voltage overhead cable is disclosed in Japanese Patent Application Publication No. 2000-2743. The method diagnoses insulation degradation of a branch joint by utilizing a high frequency current flowing through a lead-in cable.

As shown in FIG. 2, a lead-in cable 202 is branched from an overhead cable 208 by a joint 203. A diagnostic device 201 comprises a current transformer 204, an amplifier 205, a spectrum analyzer 206, and a computer 207. The current transformer 204 is attached to the lead-in cable 202. The amplifier 205 amplifies the waveform of a high frequency current detected by the current transformer 204. The spectrum analyzer 206 measures the frequency spectrum of the amplified high frequency current. The computer 207 stores the waveform pattern and the frequency spectrum of a high frequency current in a memory.

Next, an insulation degradation diagnosing method of the diagnostic device 201 will be explained. The reference waveform pattern and the reference frequency spectrum of a high frequency current in the normal joint 203 are stored in advance in the memory of the computer 207. Next, the waveform pattern and the frequency spectrum of a high frequency current in the joint 203 to be diagnosed is stored in the memory of the computer 207 and compared with the reference waveform pattern and the reference frequency spectrum, respectively. By this comparison, the degree of partial discharge, that is, the degree of insulation degradation in the joint 203 is diagnosed.

When a partial discharge has occurred in the joint 203, in bands of 2 to 6 MHz and 6 to 10 MHz, the frequency spectrum of the high frequency current takes a large value. The frequency spectrum with general environmental noises takes a small value in the bands of 2 to 6 MHz and 6 to 10 MHz, therefore, the occurrence of partial discharge is easily discriminated from the occurrence of environmental noises by the above-mentioned method.

However, with the former diagnostic method, it is necessary to attach the coupling capacitor 107 to the cable 102 and stop the operation of the cable 102. Therefore, this diagnostic method is used only for inspection on shipping of the product or the characteristic evaluation at the time of development of the product. Further, since a single frequency (400 kHz) is extracted from the pulse voltage detected with the detecting impedance 108 and used for the partial discharge measurement, this method is not practical. Furthermore, the partial discharge measurement device 109 is a tuning type partial discharge measurement device etc., therefore, the circuit configuration becomes more complex.

With the latter diagnostic method, since a spectrum analyzer is used to obtain the frequency spectrum of a high frequency current, the device becomes more expensive.

DISCLOSURE OF THE INVENTION

An object of the present invention is to provide an insulation degradation diagnostic device that realizes simplification and reduction in cost of the device configuration.

Also, another object of the present invention is to provide an insulation degradation diagnostic device for precisely measuring a partial discharge that occurs in a high voltage power transmission apparatus in operation.

In order to attain the above-mentioned objects, the present invention provides an insulation degradation diagnostic device comprising: a current detector configured to have a filtering function with an amount of attenuation of −60 dB or less and a slope characteristic of −5 dB/oct or less at a commercial frequency, and detect a current flowing through a line to be measured; a first high-pass filter configured to remove a low frequency component from a current signal based on a current detected by the current detector; a low-pass filter configured to remove a high frequency component from a current signal from the first high-pass filter; an amplifier configured to amplify a current signal from the low-pass filter to a predetermined level; a second high-pass filter configured to extract a signal corresponding to a discharge current caused by a partial discharge that has occurred in the line to be measured, from a current signal amplified by the amplifier; and a discharge judgment section configured to judge whether or not a partial discharge has occurred in the line to be measured based on a signal extracted by the second high-pass filter.

According to the present invention, since the current detector is configured to have the filtering function with an amount of attenuation of −60 dB or less and a slope characteristic of −5 dB/oct or less at a commercial frequency, the filter for removing the charging current at a commercial frequency flowing through the line to be measured is no longer necessary. Therefore, with a simple configuration, it is possible to measure a partial discharge in a line to be measured in a live state at a low cost and with precision.

Further, in order to attain the above-mentioned objects, the present invention provides an insulation degradation diagnostic device comprising: a first current detector configured to have a filtering function with an amount of attenuation of −60 dB or less and a slope characteristic of −5 dB/oct or less at a commercial frequency, and detect a current flowing through a line to be measured; a first amplifier configured to amplify a signal based on a current detected by the first current detector to a predetermined level; a low band pass filter configured to allow a frequency component belonging to a first frequency band to pass through, from a signal amplified by the first amplifier; a first high band pass filter configured to allow a frequency component belonging to a second frequency band to pass through, from a signal amplified by the first amplifier; a low frequency discharge judgment section configured to judge whether or not a partial discharge has occurred in the line to be measured based on a first signal from the low band pass filter; a second current detector configured to have a filtering function with an amount of attenuation of −60 dB or less and a slope characteristic of −5 dB/oct or less at a commercial frequency, and detect a current flowing through another line connected to the line to be measured; a second amplifier configured to amplify a signal based on a current detected by the second current detector to a predetermined level; a second high band pass filter configured to allow a frequency component belonging to a second frequency band to pass through, from a signal amplified by the second amplifier; a polarity judgment section configured to judge whether or not the opposite polarity is possessed by comparing the polarity of a second signal from the first high band pass filter with the polarity of a third signal from the second high band pass filter; a canceling circuit configured to remove noises from the second signal by applying an arithmetic operation to the second signal and the third signal; a high frequency discharge judgment section configured to judge whether or not a partial discharge has occurred in the line to be measured based on a fourth signal from the canceling circuit; a ratio comparison section configured to judge whether or not a partial discharge has occurred in the line to be measured based on a ratio between the first signal and the fourth signal; and a final discharge judgment section configured to finally judge whether or not a partial discharge has occurred in the line to be measured based on the judgment result by the low frequency discharge judgment section, the judgment result by the high frequency discharge judgment section, and the judgment result by the ratio comparison section.

According to the present invention, whether or not a partial discharge has occurred in the line to be measured is judged after setting the first frequency band and the second frequency band and using the three judgment results by the low frequency discharge judgment section, the high frequency discharge judgment section, and the ratio comparison section. Therefore, it is possible to improve the accuracy of the judgment of a partial discharge in a line to be measured.

BEST MODE FOR CARRYING OUT THE INVENTION

The first to fifth embodiments of the present invention will be described in detail with reference to FIGS. 3 to 25.

In the present invention, as one example of a high voltage power transmission apparatus, a power cable (hereinafter, referred to as a cable) is dealt with.

We have found the following fact. First, an amount of charge of a partial discharge detected in the cable is about 500 pC or less and in particular, about 10 to 200 pC is dominant. Second, the low frequency band of a discharge current (pulse waveform) detected in the cable is in the range of 100 to 500 KHz and in particular, the low frequency in the range of 100 to 400 kHz is dominant. In addition, the low frequency has several peaks and converges in a short time. Third, the high frequency band of a discharge current detected in the cable is within the range of 1.5 to 5 MHz. In addition, the high frequency has several peaks and converges in a short time. Note that if a partial discharge occurs in an insulator of a cable, a discharge current is induced in a conductor of the cable as a pulse waveform.

In the first to fourth embodiments of the present invention, it is assumed that a discharge current having a frequency in a low frequency band of 100 to 400 kHz as its main component is an object to be detected. By this setting, the diagnostic device is capable of extracting a waveform substantially corresponding to the original waveform of a discharge current without being affected by the influence of such as harmonics by removing noises, it is therefore possible to discriminate between the waveform of a discharge current and the waveform of a noise and at the same time, to diagnose the degree of insulation degradation of a cable.

In the fifth embodiment of the present invention, it is assumed that a discharge current having, frequencies in a low frequency band of 100 to 500 kHz and in a high frequency band of 1.5 MHz to 5 MHz as its main components is an object to be detected. By this setting, it is possible for a diagnostic device to discriminate whether a detected partial discharge has occurred from a cable or has occurred from a power apparatus (motor, transformer, etc.) connected to a cable, in addition to the advantage of the setting only in the low frequency band.

FIRST EMBODIMENT

Figure 1A:
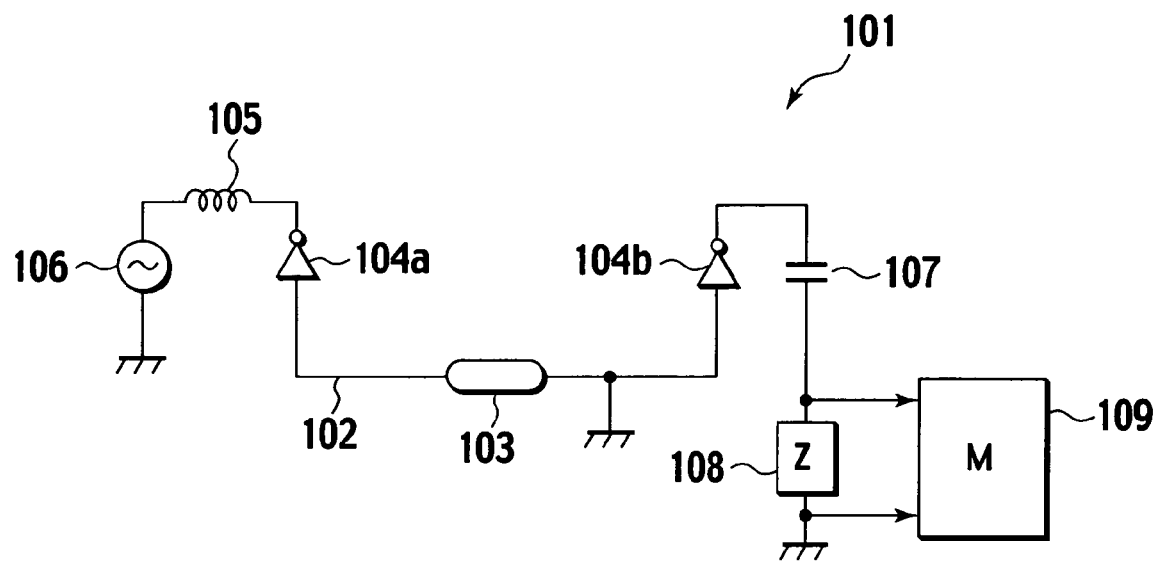
FIG. 1A is a wiring diagram of a conventional device for diagnosing insulation degradation of a high voltage power transmission apparatus.
Figure 1B:
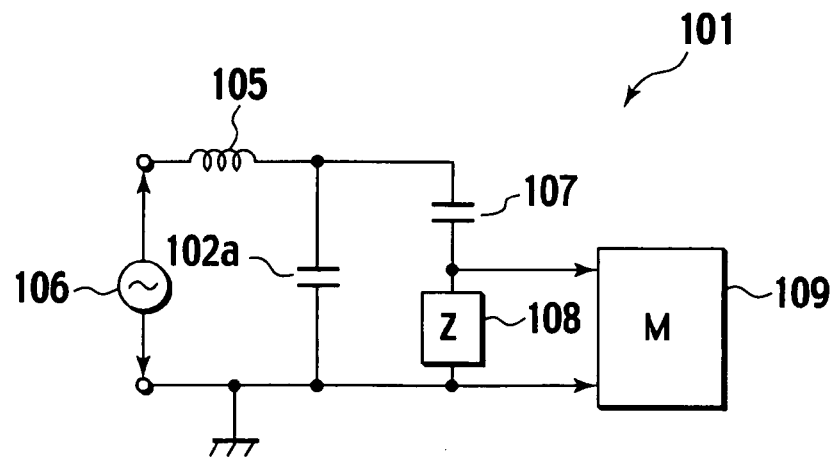
FIG. 1B is an equivalent circuit diagram of the conventional device for diagnosing insulation degradation of the high voltage power transmission apparatus.
Figure 2:
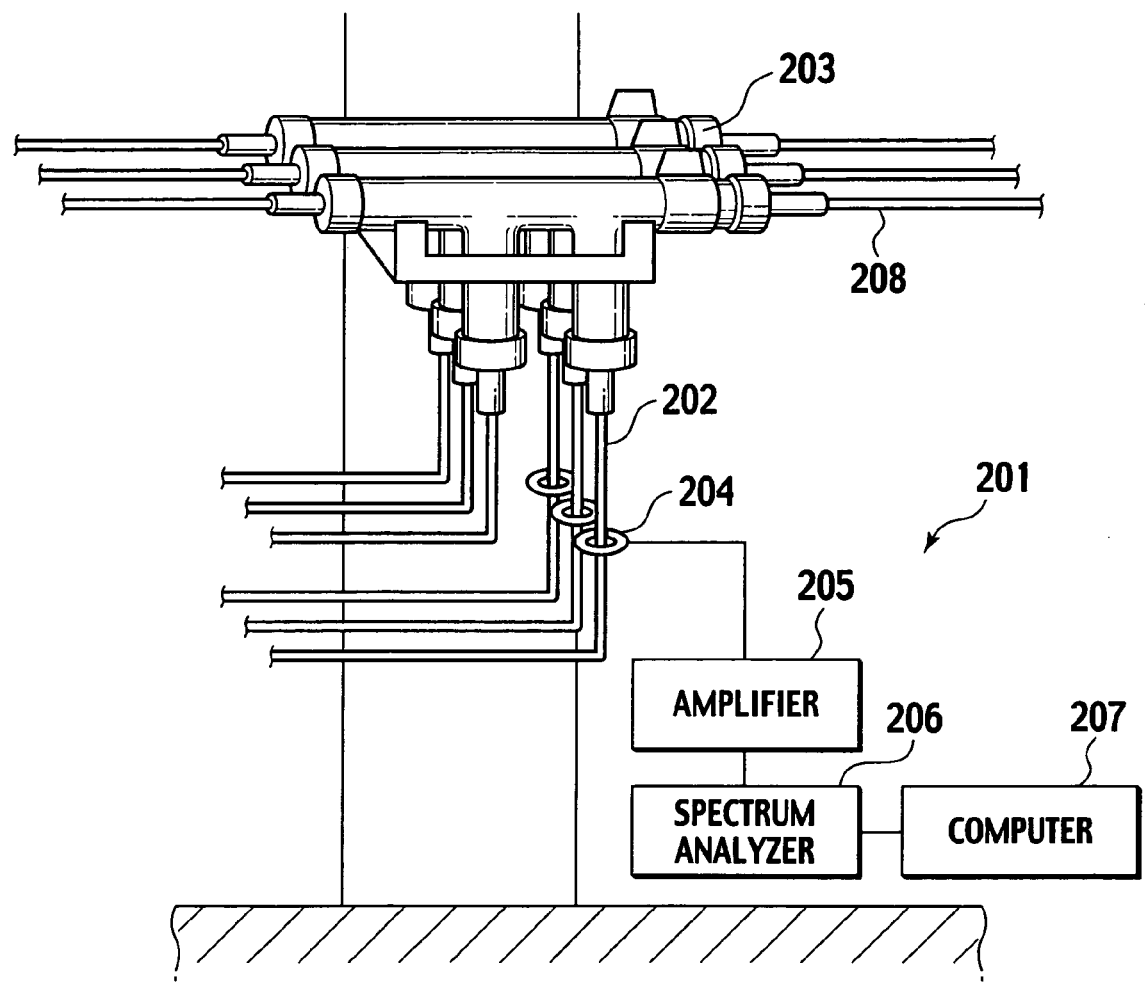
FIG. 2 is a configuration diagram of another conventional device for diagnosing insulation degradation of a high voltage power transmission apparatus.
Figure 3:
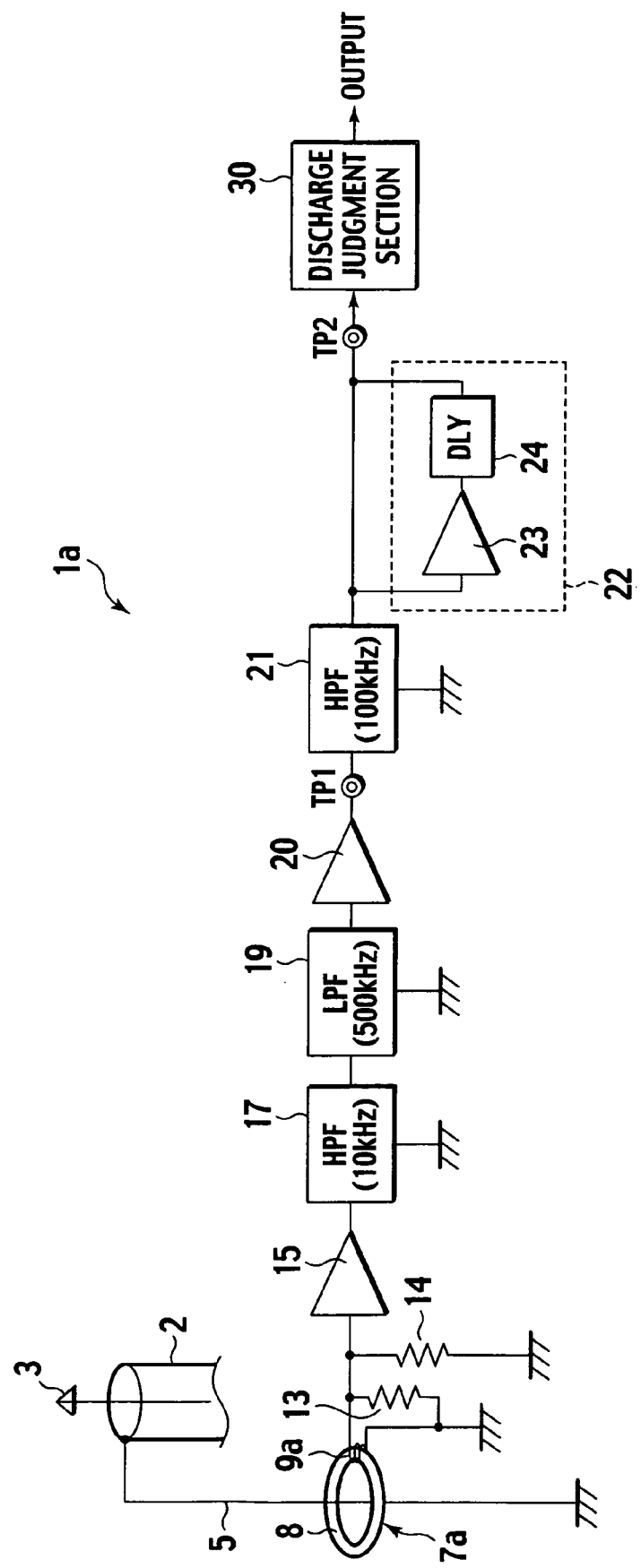
FIG. 3 is a configuration diagram of a diagnostic device according to a first embodiment of the present invention.

As shown in FIG. 3, a cable 2 has an end portion to which a terminal joint 3 is attached. A grounding conductor 5 has one end connected to a shielding layer on the outer circumferential surface of the end portion of the cable 2 and the other end grounded. The grounding conductor 5 is composed of, for example, an IV wire. The IV wire is composed of PVC with a thickness of 0.8 mm enclosing the outer circumference of a copper twisted wire. The shielding layer of the grounding conductor 5 is composed of a copper tape etc. Here, the grounding conductor 5 corresponds to a line to be measured of the present invention.

A diagnostic device 1a is attached to the grounding conductor 5. The diagnostic device 1a comprises a current transformer (CT) 7a, a load resistor 13, a resistor 14, a first amplifier 15, a first high-pass filter (first HPF) 17, a low-pass filter (LPF) 19, a second amplifier 20, a second high-pass filter (second HPF) 21, a delay circuit 22, and a discharge judgment section 30.

The current transformer 7a is formed into a clamp-shape and includes a core 8 and an output winding (secondary winding) 9a. The core 8 is formed into an annular shape and has a hollow portion through which the grounding conductor 5 penetrates. The core 8 is, for example, a ferrite core. The output winding 9a is wound around the core 8 several times (for example, ten times) and has a first end portion grounded. When a current flowing through the grounding conductor 5 changes, an induced current flows through the output winding 9a. Therefore, when a discharge current flows through the grounding conductor 5, an induced current occurs in the output winding 9a in accordance with the pulse waveform of the discharge current. Here, the current transformer 7a corresponds to the current detector of the present invention.

Figure 4:
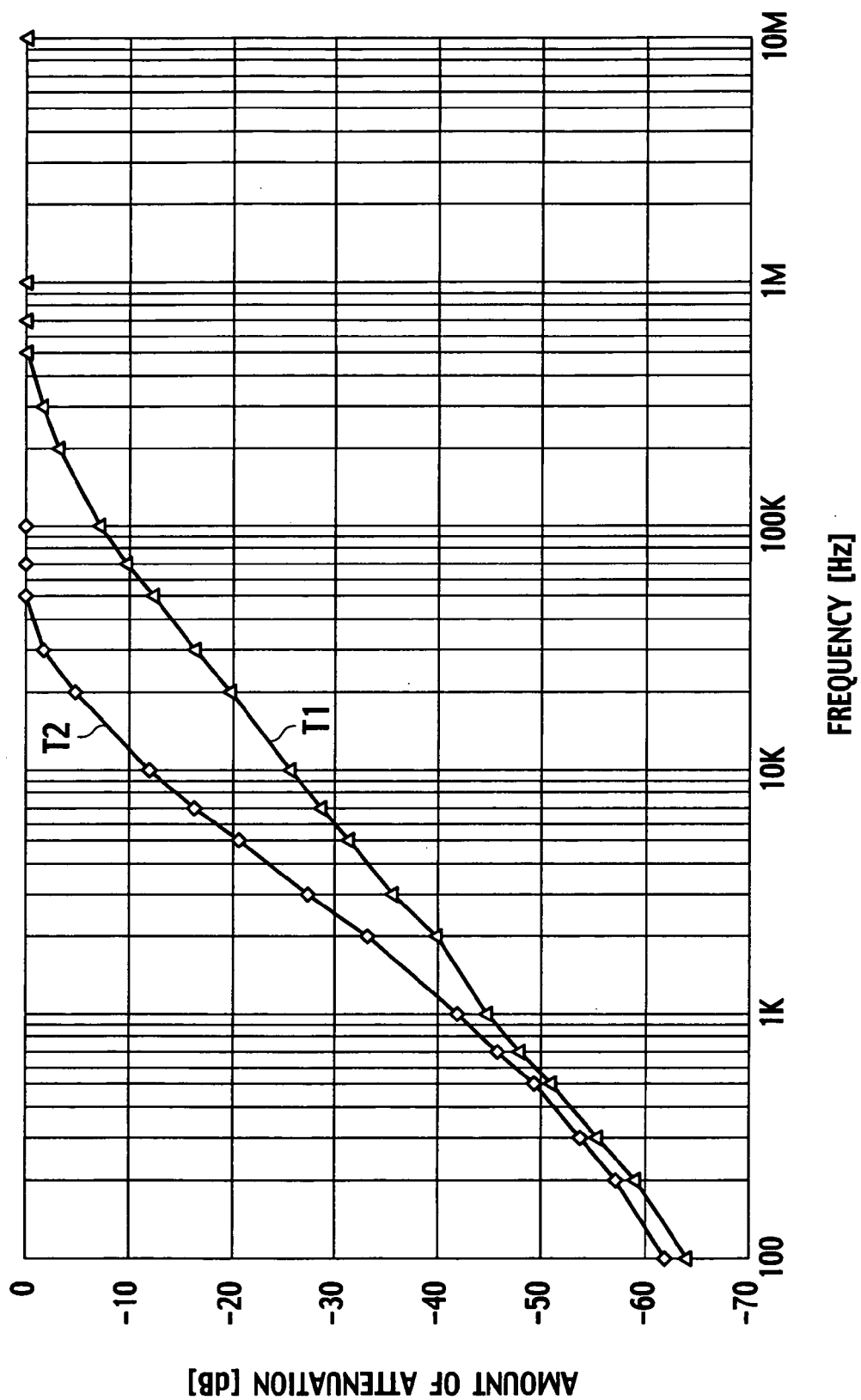
FIG. 4 is a diagram showing the frequency characteristics of a current transformer according to the first embodiment and a second embodiment of the present invention.

As shown in FIG. 4, the current transformer 7a has a frequency characteristic of a characteristic line T1. The characteristic line T1 has an amount of attenuation of −60 dB or less and a slope characteristic of −5 dB/oct or less at a commercial frequency (50 Hz or 60 Hz), therefore, the current transformer 7a functions as a high-pass filter. The load resistor 13 is connected to both ends of the output winding 9a and has, for example, a resistance of 100 O.

The resistor 14 has a first end portion connected to the second end portion of the output winding 9a and a second end portion grounded. The first amplifier 15 has a first end portion connected to the first end portion of the resistor 14. When an induced current flows through the resistor 14, the first amplifier 15 amplifies a voltage that develops across both ends of the resistor 14 by a factor of about 10 and outputs a first amplification signal. The first amplification signal is output to the first high-pass filter 17 from the first amplifier 15.

The first high-pass filter 17 has a first end portion connected to the second end portion of the first amplifier 15. The first high-pass filter 17 removes a low frequency component equal to or lower than a first cutoff frequency from the first amplification signal. The first cutoff frequency is about 10 kHz. The first amplification signal from which the low frequency component has been removed is output to the low-pass filter 19 from the first high-pass filter 17.

The low-pass filter 19 has a first end portion connected to the second end portion of the first high-pass filter 17. The low-pass filter 19 removes a high frequency component equal to or higher than a second cutoff frequency from the first amplification signal from which the low frequency component has been removed. The second cutoff frequency is about 300 to 500 kHz. In the present embodiment, 500 kHz is applied as the second cutoff frequency. The first amplification signal from which the high frequency component has been removed is output to the second amplifier 20 from the low-pass filter 19.

The second amplifier 20 has a first end portion connected to the second end portion of the low-pass filter 19. The second amplifier 20 amplifies the first amplification signal from which the high frequency component has been removed by a factor of about 100 and outputs a second amplification signal. The second amplification signal is output from the second amplifier 20 to the second high-pass filter 21.

Figure 5:
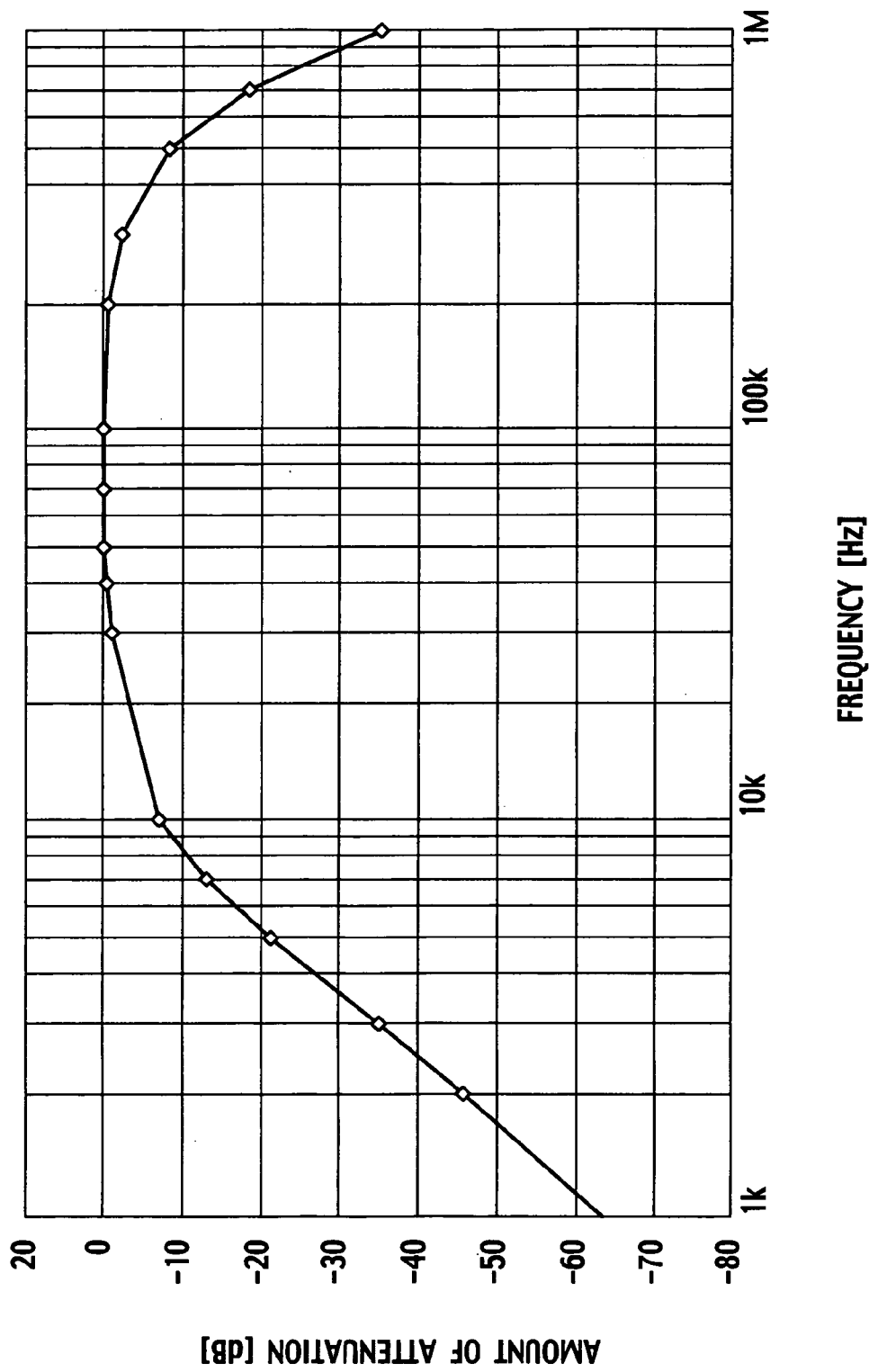
FIG. 5 is a diagram showing the frequency characteristics of a first stage filter according to the first embodiment of the present invention.

The first stage filter includes the current transformer 7a, the first high-pass filter 17, and the low-pass filter 19 and has the frequency characteristic shown in FIG. 5. The shielding frequency of the first high-pass filter 17 and the low-pass filter 19 in the first stage filter is about 10 kHz and 300 to 500 kHz, respectively. Therefore, the amount of attenuation in the first stage filter takes a value between −10 and 0 dB for a frequency between 10 and 500 kHz.

The second high-pass filter 21 has a first end portion connected to the second end portion of the second amplifier 19. The second high-pass filter 21 removes a low frequency component equal to or lower than a third cutoff frequency from the second amplification signal. The third cutoff frequency is about 100 to 200 kHz. In the present embodiment, 100 kHz is applied as the third cutoff frequency. The second amplification signal from which the low frequency component has been removed is output from the second high-pass filter 21 to the discharge judgment section 30.

The delay circuit 22 has a first end portion connected to the second end portion of the second high-pass filter 21 and a second end portion connected to the first end portion of the discharge judgment section 30. The delay circuit 22 is composed of an inversion amplifier 23 and a delay element (DLY) 24. The delay circuit 22 has the function of an active filter that cancels harmonics from the second amplification signal from the second high-pass filter 21. Here, the delay circuit 22 may be omitted.

The inversion amplifier 23 inverts the second amplification signal from the second high-pass filter 21 and outputs the inverted signal to the delay element 24. The delay element 24 delays the inverted signal by a minute time (for example, 0.5 μs) and outputs the delayed signal. The delayed signal is combined with the second amplification signal from the second high-pass filter 21. The combined signal is output to the discharge judgment section 30. Due to this, even when the second amplification signal includes harmonics, the harmonics are canceled nearly completely by the delay circuit 22, therefore, a signal with less distorted waveform is obtained.

Figure 6:
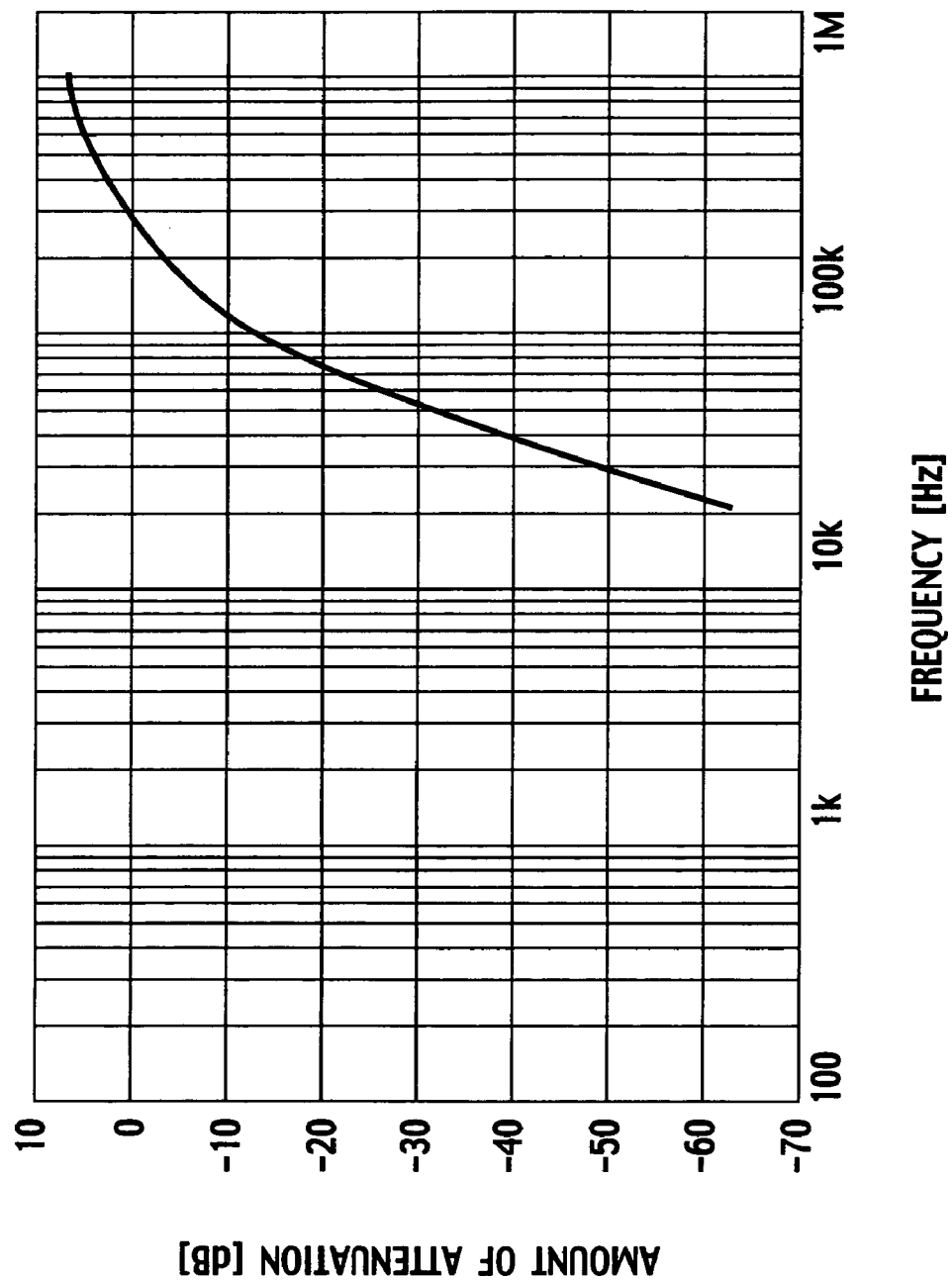
FIG. 6 is a diagram showing the frequency characteristics of a second stage filter according to the first embodiment of the present invention.

The second stage filter is composed of the second high-pass filter 21 and the delay circuit 22 and has the frequency characteristic shown in FIG. 6. The second stage filter has a slope characteristic of −18 dB/oct. In the second stage filter, the cutoff frequency of the second high-pass filter 21 is 100 to 200 kHz. Therefore, the amount of attenuation in the second stage filter takes a value between −10 to 10 dB at a frequency between 100 to 500 KHz.

The discharge judgment section 30 judges whether or not a partial discharge has occurred in the cable 2 based on the combined signal. In the discharge judgment processing, whether or not the combined signal is a signal caused by the partial discharge in the cable 2 is judged by detecting the p-p value, the p-p time, and the number of peaks of the input signal. Here, the p-p value is defined as an amplitude value between the peak of a certain waveform and the peak of a waveform adjoining the waveform. The p-p time is defined as a time between the first peak and the last peak of the waveform. Here, the discharge judgment section 30 corresponds to the discharge judgment section of the present invention.

Next, the operation of the diagnostic device 1a will be described.

Through the cable 1 in operation, a charging current flows. The charging current is a current having a commercial frequency (50 Hz or 60 Hz). In this state, also through the grounding conductor 5, the charging current flows.

If a partial discharge occurs in the cable 1 in operation, a discharge current is overlapped to the charging current and flows through the grounding conductor 5. When the discharge current flows through the grounding conductor 5, an induced current occurs in the output winding 9a in accordance with the pulse waveform of the discharge current. At this time, the charging current having a commercial frequency is removed by the filtering function of the current transformer 7a.

The first amplifier 15 amplifies a current signal based on the induced current from the current transformer 7a by a factor of about 10 and outputs the first amplification signal to the first high-pass filter 17. The first high-pass filter 17 removes a low frequency component equal to or lower than about 10 kHz from the first amplification signal and outputs it to the low-pass filter 19. The low-pass filter 19 removes a high frequency component equal to or higher than about 500 kHz from the first amplification signal from which the low frequency component has been removed and outputs it to the second amplifier 20. The second amplifier 20 amplifies the first amplification signal from which the high frequency component has been removed by a factor of about 100 and outputs the second amplification signal to the second bypass filter 21. The second high-pass filter 21 removes a low frequency component equal to or lower than about 100 kHz from the second amplification signal and outputs it to the discharge judgment section 30.

Figure 7:
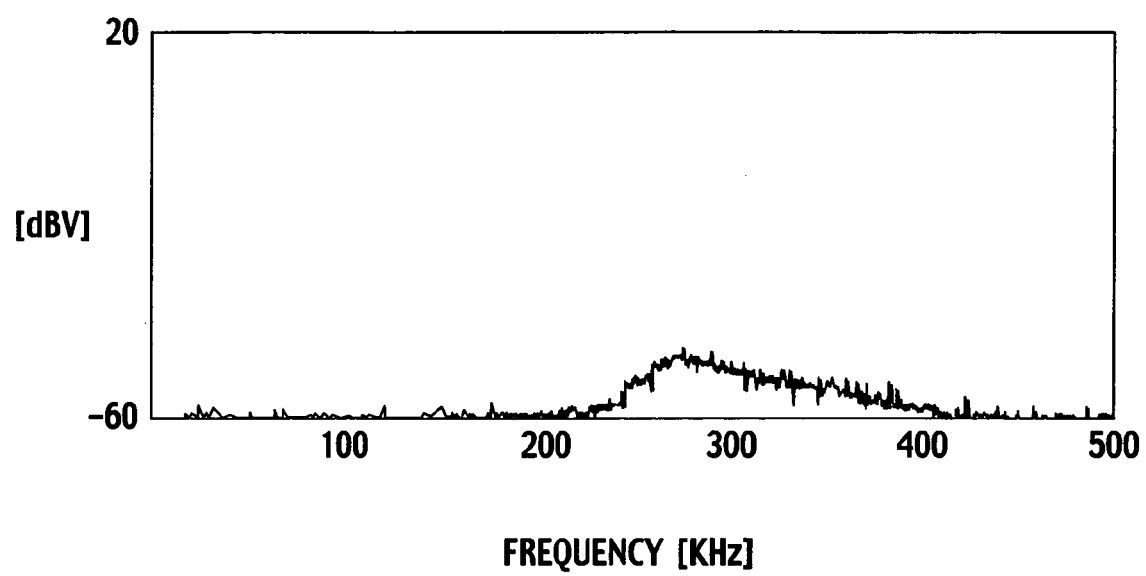
FIG. 7 is the frequency characteristics of a first amplification signal input to a low-pass filter according to the first embodiment of the present invention.
Figure 8:
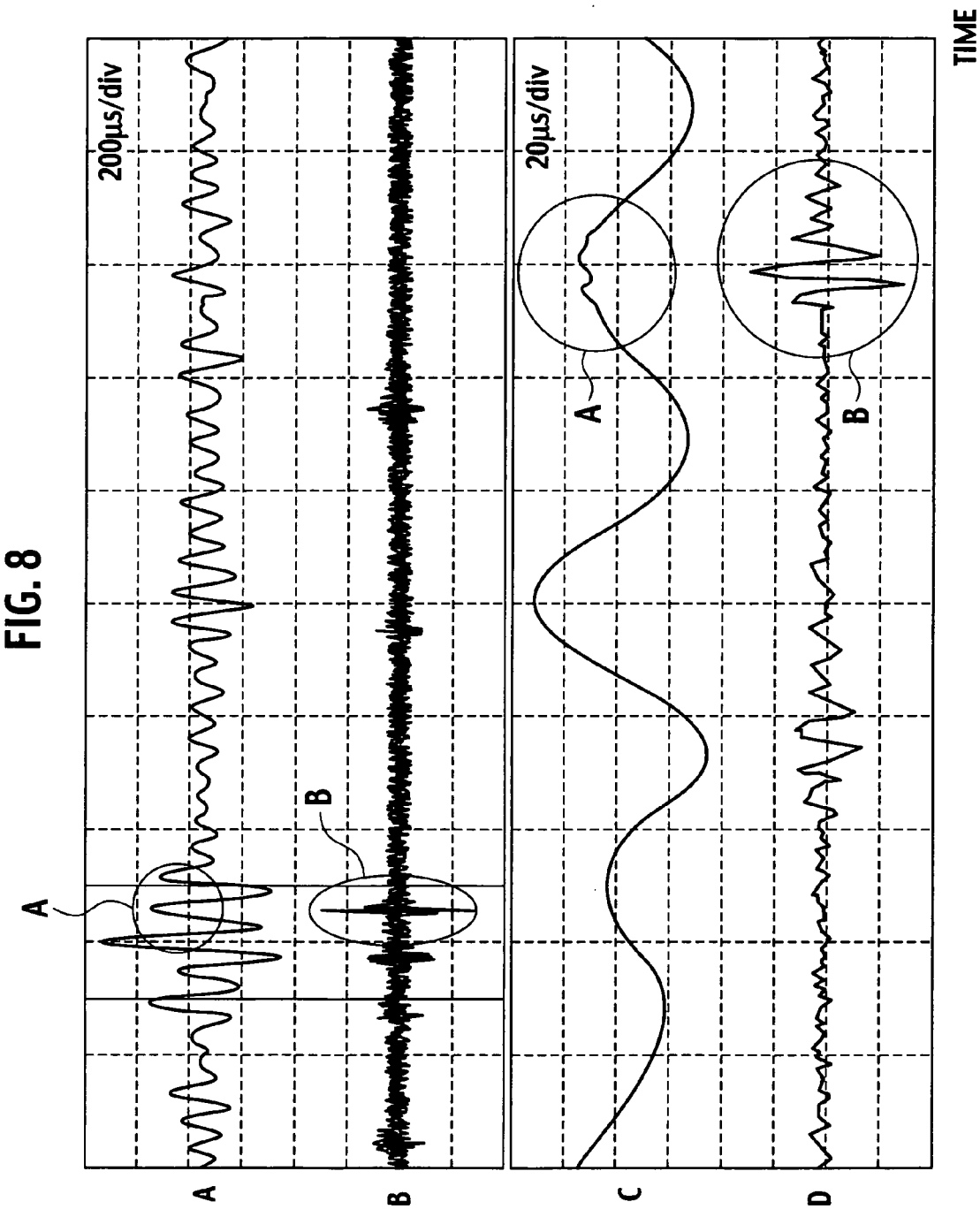
FIG. 8A is a diagram showing a frequency spectrum of a second amplification signal at a TP of the diagnostic device according to the first embodiment of the present invention.
FIG. 8B is a diagram showing the frequency spectrum of the second amplification signal at a TP2 of the diagnostic device according to the first embodiment of the present invention.
FIG. 8C is a diagram in which the time scale in FIG. 8A is partially enlarged.
FIG. 8D is a diagram in which the time scale in FIG. 8B is partially enlarged.

If a frequency analysis is performed with a spectrum analyzer on the first amplification signal from which the low frequency component has been removed to be input to the low-pass filter 19, the frequency characteristics as shown in FIG. 7 are obtained. Referring to the frequency characteristics, the frequency component of the input first amplification signal is about 100 to 400 kHz. Therefore, it is preferable to set the cutoff frequency of the low-pass filter 19 to about 500 kHz.

The signal waveform at TP1 of the second amplification signal output from the second amplifier 20 has, for example, a waveform as shown in FIG. 8A and FIG. 8C. Here, FIG. 8C shows a part of FIG. 8A in which the time scale is enlarged. The signal waveform at TP1 has a frequency component of about tens of kHz. The concave portion present in the vicinity of the top portion of the waveform shown by a circle mark A is a part generated by the pulse waveform of the discharge current. Therefore, in order to detect the signal waveform caused by the discharge current, it is necessary to remove a frequency component of tens of kHz from the signal waveform at TP1.

The signal waveform at TP2 of the second amplification signal from the second high-pass filter 21 has, for example, a waveform as shown in FIG. 8B and FIG. 8D. Here, FIG. 8D shows a part of FIG. 8B in which the time scale is enlarged. The part denoted by the circle mark B corresponds to the part denoted by the circle mark A of the signal waveform at TP1. Since the frequency component of tens of kHz has been removed from the signal waveform at TP1 by the second high-pass filter 21, the signal waveform at TP2 becomes substantially flat before and after the signal waveform caused by the pulse waveform of the discharge current. Therefore, it facilitates discharge judgment processing in the discharge judgment section 30.

Note that it may also be possible to further connect a second low-pass filter, a third high-pass filter, and a third low-pass filter in this order to the second end portion of the second high-pass filter 21 to remove noises. The second low-pass filter has a cutoff frequency of 300 to 500 kHz. The third high-pass filter has a cutoff frequency of 100 to 200 kHz. The third low-pass filter has a cutoff frequency of 300 to 500 kHz.

The discharge judgment section 30 samples an input signal (analog signal) for, for example, 0.1 to 0.2 μs and converts it to a digital signal. The discharge judgment section 30 performs discharge judgment processing on this digital signal.

Next, the discharge judgment processing by the discharge judgment section 30 will be described.

The discharge judgment section 30 first judges whether or not the p-p value of the waveform of an input signal is equal to or less than the absolute value (reference value) of the difference between the upper limit value and the lower limit value set in advance. The reference value is, for example, 20 to 200 mV.

When the p-p value is not equal to or less than the reference value, the input signal is not a signal caused by a partial discharge in the cable 2 but a noise signal having a large amplitude, therefore, the discharge judgment section 30 ends the discharge judgment processing.

When the p-p value is equal to or less than the reference value, the input signal is a signal caused by a partial discharge in the cable 2, therefore, the discharge judgment section 30 performs the following processing. In the above-mentioned judgment, the noise signal having a large amplitude is removed.

Next, the discharge judgment section 30 judges whether or not the p-p time of the waveform of the input signal is equal to or less than a predetermined time (for example, 20 μs). When the p-p time is not equal to or less than the predetermined time, the input signal is not a signal caused by a partial discharge in the cable 2, therefore, the discharge judgment section 30 ends the discharge judgment processing. When the p-p time is equal to or less than the predetermined time, the input signal is a signal caused by a partial discharge in the cable 2, that is, a signal having a waveform that converges in a short time, therefore, the discharge judgment section 30 performs the following processing.

Here, the pulse waveform of the discharge current has several peaks and converges in a short time, therefore, when the p-p time is greater than the predetermined time, the input signal is judged to be a signal caused by noises.

Next, the discharge judgment section 30 counts the number of times of discharge judgment processing performed in a unit time using a counter. When the number of times is equal to or more than a predetermined value (for example, five times), the discharge judgment section 30 judges that the input signal is a signal caused by the discharge current and outputs the information to the outside. When the number of times is less than a predetermined value, the discharge judgment section 30 judges that the input signal is a signal caused by noises and ends the discharge judgment processing.

The diagnostic device 1a has the following advantageous features.

Since the current transformer having the frequency characteristics that the amount of attenuation and the slope characteristic at a commercial frequency is −60 dB or less and −5 dB/oct or less, respectively, is used as a current detector and used to provide a filtering function, it is not necessary to provide a filter for removing the charging current at a commercial frequency flowing through the cable 2.

Since it is not necessary to provide a coupling capacitor, a spectrum analyzer, etc., simplification and reduction in cost can be realized for the device configuration.

Since a partial discharge in a cable is measured without stopping the operation of the grounding conductor 5, it is possible to measure a partial discharge that occurs in the cable in operation.

The partial discharge in the cable is a discharge with a pulse wavelength having a frequency of about 100 to 400 kHz as its main frequency component. Therefore, the noise component is removed by setting the cutoff frequency of the low-pass filter 19 and the second high-pass filter 21 to about 500 kHz and 100 kHz, respectively. As a result, it is possible to extract the signal waveform that has occurred by the pulse waveform of the discharge current as a waveform substantially corresponding to the original waveform of the discharge current without influence of harmonics etc.

The discharge judgment section 30 judges that a signal is a signal based on a discharge current caused by a partial discharge only when the p-p value of an input signal is equal to or less than the absolute value of the difference between the upper limit value and the lower limit value set in advance, the p-p time is equal to or less than a predetermined time, and the number of times of discharge judgment processing is equal to or more than a predetermined value. Therefore, a signal caused by a discharge current is discriminated from a signal caused by noises without fail.

Once a partial discharge occurs, it continues for a certain period of time, therefore, by counting the number of times of partial discharge that has occurred in a predetermined time (unit time), that is, by counting the number of times of discharge judgment processing performed, a partial discharge can be discriminated from sudden noises such as opening/closing surges.

The signal waveform based on a discharge current caused by a partial discharge is amplified by a factor of 1000 or more by the first amplifier 15 and the second amplifier 20. Therefore, even if a partial discharge is a minute amount of discharge charge (1 pC) or less, the above-mentioned signal waveform is detected with high sensitivity.

Since a discharge current is measured by attaching a current transformer to the grounding conductor of a power transmission apparatus, therefore, it is not necessary to modify the power transmission apparatus for diagnosis of insulation degradation.

Incidentally, the diagnostic device 1a can be applied to the insulation performance evaluation, the insulation diagnosis, and the monitoring of insulation of various power transmission apparatuses with high voltage or with particularly high voltage. Further, the diagnostic device 1a can be used for the characteristic evaluation test at the time of development, the inspection of the product on shipping, and the insulation diagnosis/monitoring for an apparatus in operation.

In the discharge judgment processing, it is also possible to identify a cause of occurrence of a partial discharge by comparing the signal waveform input to the discharge judgment section 30 with: the signal waveform of the next partial discharge stored in advance; the signal waveform of the partial discharge before discharge degradation begins; the signal waveform of the partial discharge that occurs in various degraded portions; the signal waveform of the partial discharge that occurs at a poorly worked defective portion at which discharge degradation is advancing; and the signal waveform of the partial discharge when a copper tape is broken; and the like.

SECOND EMBODIMENT

Figure 9:
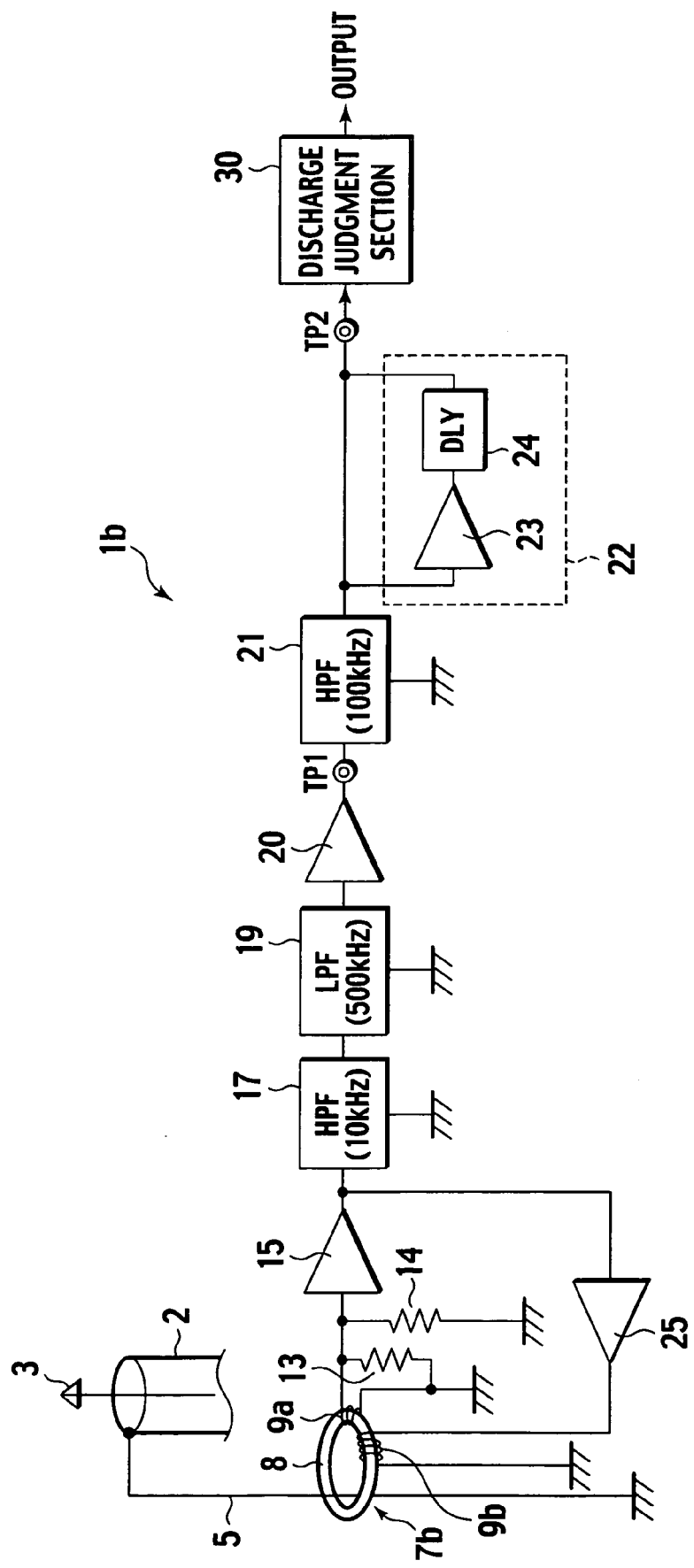
FIG. 9 is a configuration diagram of a diagnostic device according to the second embodiment of the present invention.

As shown in FIG. 9, a diagnostic device 1b has the same configuration as that of the diagnostic device 1a except in that a current transformer 7b is used as a current detector and a canceling amplifier 25 is added. Here, the same symbols are attached to the same members as those in the first embodiment and their detailed description is omitted.

The current transformer 7a has the frequency characteristic that the amount of attenuation and the slope characteristic at a commercial frequency are −60 dB or less and −5 dB/oct or less, respectively, as a current detector and a filtering function. In the present embodiment, this function is realized using a current transformer generally used currently.

When a current transformer generally used currently is applied as a current detector of the diagnostic device 1a, if a large current to which a discharge current has been overlapped flows through the grounding conductor 5, the core of the current transformer or the amplifier saturates. Accompanying this, even if low frequency and high frequency components are removed from an input signal using the first high-pass filter 17, the low-pass filter 20, and the second high-pass filter 21, it is not possible to detect a discharge current successfully.

Therefore, by causing a current transformer to have the filtering function of removing a low frequency component (about 10 kHz) from a commercial frequency, it is possible to correctly detect a discharge current flowing through a grounding conductor without causing the core of the current transformer or the amplifier to saturate.

The diagnostic device 1b uses the current transformer 7b instead of the current transformer 7a. The current transformer 7b includes the core 8, the output winding (secondary winding) 9a and a tertiary winding 9b. The core 8 is formed into an annular shape and has a hollow portion through which the grounding conductor 5 penetrates. The core 8 is, for example, a permalloy core. The output winding 9a is wound around the core 8 200 times and has a first end portion grounded. When a discharge current flows through the grounding conductor 5, an induced current occurs in the output winding 9a in accordance with the pulse waveform of the discharge current. To both ends of the output winding 9a, the load resistor 13 (for example, 200 Ω) is connected. The tertiary winding 9b is wound around the core 8 several times and has a first end portion grounded.

The canceling amplifier 25 has a first end portion connected to the second end portion of the first amplifier 15 and a second end portion connected to the second end portion of the tertiary winding 9b.

The first amplifier 15 amplifies a current signal based on an induced current by a factor of about 10. The canceling amplifier 25 amplifies the current signal from the first amplifier 15 and outputs the amplified current signal to the tertiary winding 9b in order to remove a low frequency component of the induced current output from the output winding 9a.

The current transformer 7b has a high-pass filtering function of removing a low frequency component by introducing the tertiary winding 9b and the canceling amplifier 25 to the current transformer 7a. The cutoff frequency of the current transformer 7b is a commercial frequency to 10 kHz.

As shown in FIG. 4, the current transformer 7b has the frequency characteristic of the characteristic line T2. The characteristic line T2 has an amount of attenuation of −60 dB or less and a slope characteristic of −60 dB/oct or less at a commercial frequency (50 Hz or 60 Hz). Therefore, the current transformer 7b functions as a high-pass filter without fail.

Next, the operation of the diagnostic device 1b will be described.

When a discharge current flows through the grounding conductor 5, an induced current occurs in the output winding 9a and the tertiary winding 9b in accordance with the pulse waveform of the discharge current. The first amplifier 15 amplifies the induced current from the output winding 9a and outputs the first amplification signal. The first amplification signal is further amplified in the canceling amplifier 25 and input to the tertiary winding 9b. Due to this, the first amplification signal from the canceling amplifier 25 removes a low frequency component (a commercial frequency to 10 kHz) from the induced current output from the output winding 9a.

Figure 10:
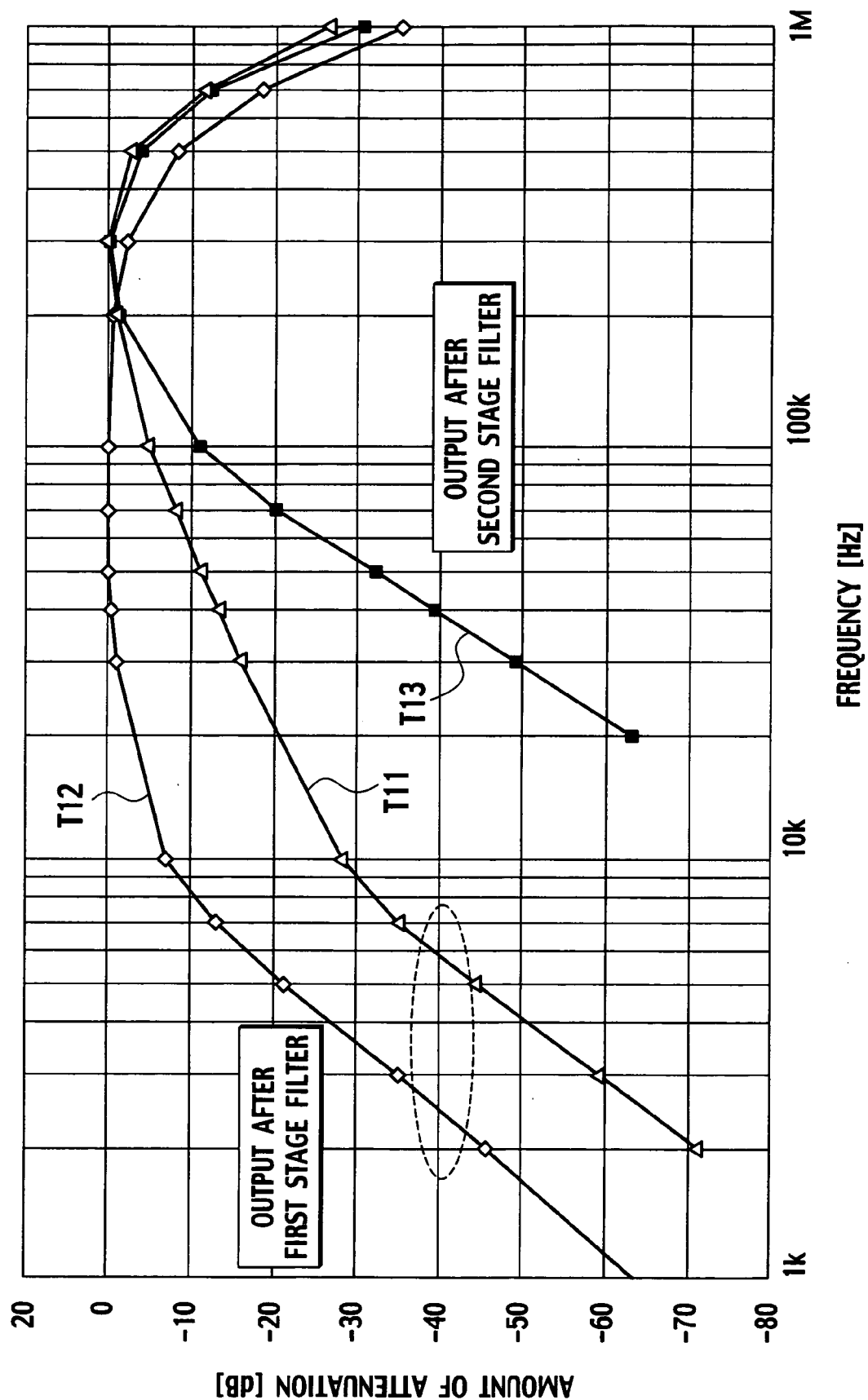
FIG. 10 is a diagram showing the frequency characteristics of the first and second stage filters according to the first and second embodiments of the present invention.

FIG. 10 shows a frequency characteristic T11 of the first stage filter in the diagnostic device 1a, a frequency characteristic T12 of the first stage filter in the diagnostic device 1b, and a frequency characteristic T13 of the second stage filter in the diagnostic devices 1a and 1b. The frequency characteristic T11 has substantially the same characteristic as that of the frequency characteristic T12.

The diagnostic device 1b has the following advantageous features.

By winding the tertiary winding 9b around a current transformer generally used currently and adding the canceling amplifier 25 for inputting a current signal to the tertiary winding 9b, it is possible to removed a low frequency component (a commercial frequency to equal to or less than 10 kHz) from an induced current from the tertiary winding 9b. Therefore, it is possible for the diagnostic device 1b to realize a function equivalent to that of the diagnostic device 1a.

THIRD EMBODIMENT

A diagnostic device 1c identifies a cable in which a partial discharge has occurred using a plurality of current transformers. The diagnostic device 1c is configured by a plurality of diagnostic devices 1a or diagnostic devices 1b, however, the processing performed in the discharge judgment section 30 of the diagnostic device 1a or the diagnosis device 1b is different.

Figure 11:
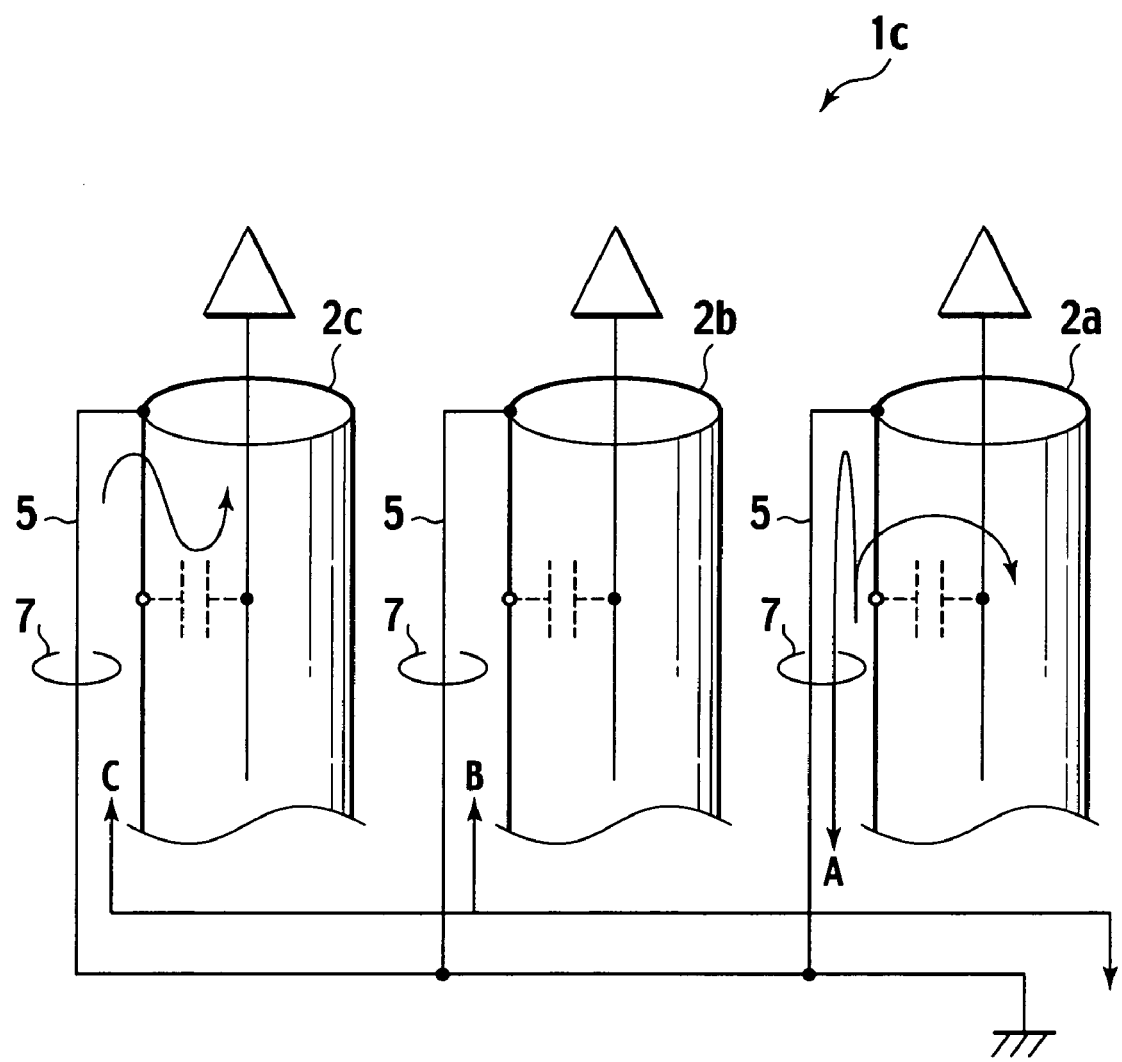
FIG. 11 is a partial configuration diagram of a diagnostic device according to a third embodiment of the present invention.

As shown in FIG. 11, in the diagnostic device 1c, at least three cables 2a, 2b, and 2c are used. The grounding conductors 5, 5, and 5 of the cables 2a, 2b, and 2c are commonly grounded and the current transformers 7, 7, and 7 are attached to the grounding conductors 5, 5, and 5. Here, the current transformer 7 is the current transformer 7a or the current transformer 7b. The diagnostic device 1c includes the discharge judgment sections 30, 30, and 30 (not shown) in accordance with the cables 2a, 2b, and 2c. The discharge judgment sections 30, 30, and 30 have respective second end portions connected to a microcomputer, a personal computer, an oscilloscope (current direction judgment section), etc.

If a partial discharge occurs in the cable 2a, a discharge current in the cable 2a flows on the grounding conductor 5 in the direction of the arrow A. At this time, since the grounding conductors 5, 5, and 5 of the cables 2a, 2b, and 2c are commonly grounded, the discharge currents in the cables 2b and 2c flow in the direction of the arrows B and C opposite to the direction of the arrow A with substantially the same timing.

When signals are input from the discharge judgment sections 30, 30, and 30, respectively, the current direction judgment section judges whether or not the signals occur with the same timing. When they occur with the same timing, the phases of the three signals are analyzed. When they do not occur with the same timing, the processing ends. In the phase analysis, when the phase of one signal is opposite to the phases of the other two signals, it is judged that a partial discharge has occurred in the cable (in FIG. 11, the cable 2a) connected to the current transformer that has produced the one of the signals. When all of the phases of the three signals are the same, it is judged that a partial discharge has occurred in a cable other than the cables 2a, 2b, and 2c.

The diagnostic device 1c has the following advantageous features.

When there exist a plurality of cables, it is possible to easily identify a cable in which a partial discharge has occurred.

Note that in the above-mentioned first to third embodiments, the insulation degradation diagnostic device is configured so as to detect a discharge current flowing through the grounding conductor 5 of the cable 2 with a current transformer. However, it is also possible to configure so as to detect a current flowing through the cable 2 with a current transformer. In this case also, the same function and effect as those in the above-mentioned first to third embodiments can be obtained.

FOURTH EMBODIMENT

A diagnostic device 1d measures a partial discharge after removing (reducing) noises that have occurred on the cable.

Figure 12:
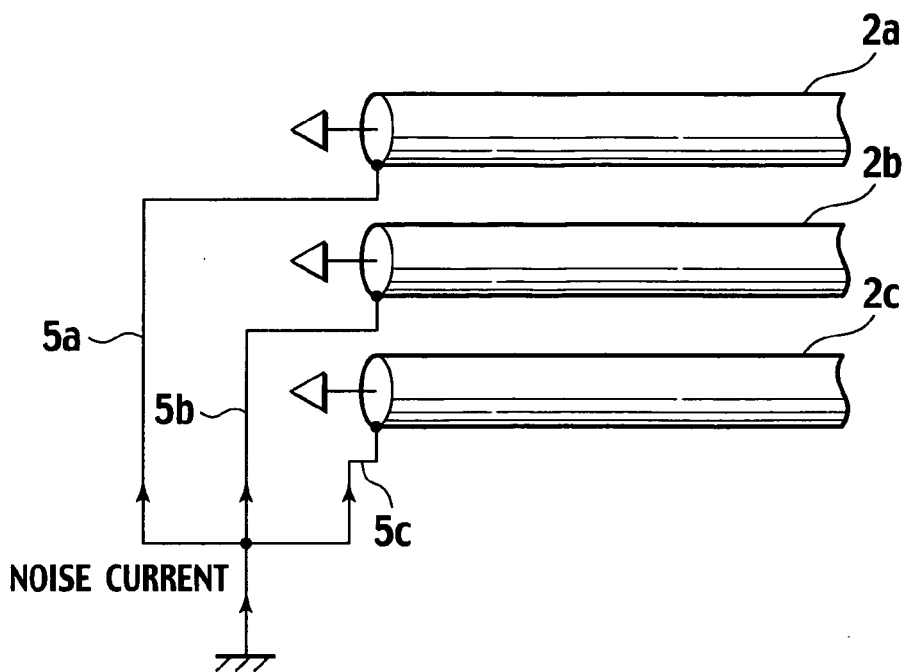
FIG. 12 is a diagram for explaining a state in which a noise current occurs in a diagnostic device according to a fourth embodiment of the present invention.

As shown in FIG. 12, when grounding conductors 5a, 5b, and 5c are connected to the common grounding bus line, if noises invade the grounding bus line through a certain point, a noise current having substantially the same waveform flows through the grounding conductors 5a, 5b, and 5c in the direction shown by the arrow. Here, the grounding conductors 5a, 5b, and 5c are connected to one end of the shielding layer (copper tape etc.) formed on the outer circumferential surface of the terminal end of the plurality of cables 2a, 2b, and 2c.

Figure 13:
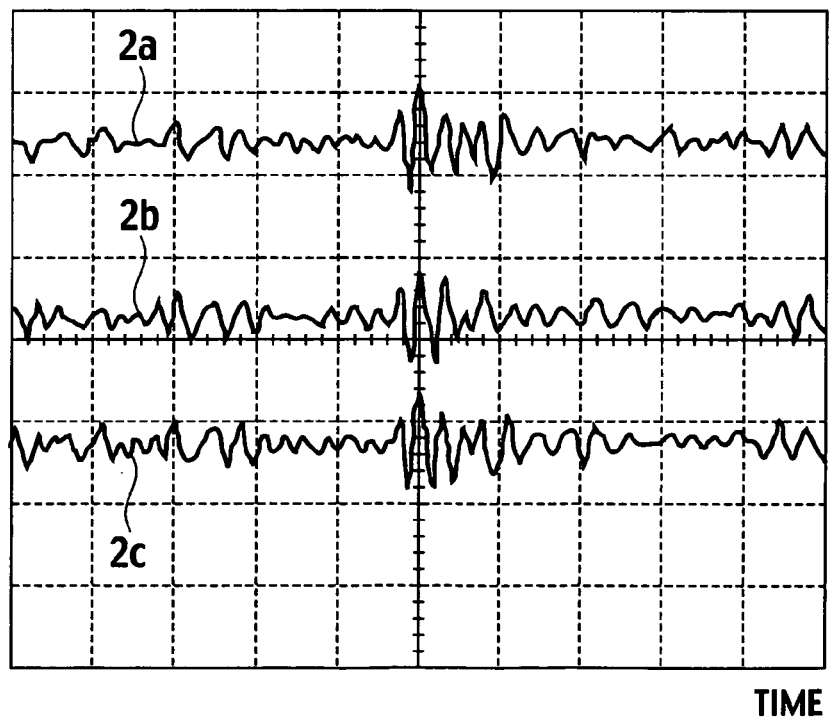
FIG. 13 is a diagram showing an actually measured waveform of a noise current in the diagnostic device according to the fourth embodiment of the present invention.

For example, when the cables 2a, 2b, and 2c are laid in a factory, as shown in FIG. 13, noise currents having substantially the same waveform and phase flows through the cables 2a, 2b, and 2c.

Figure 14:
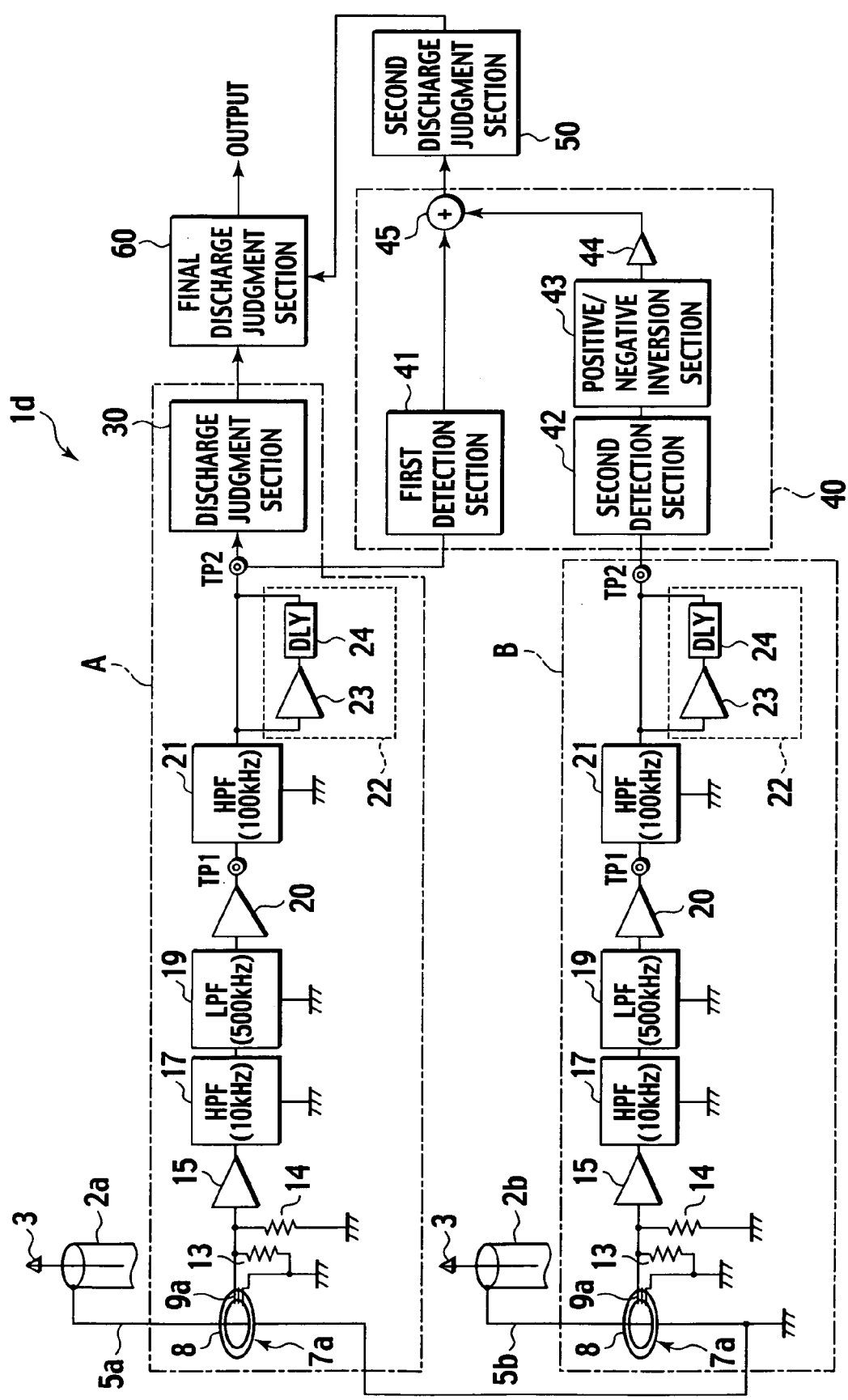
FIG. 14 is a configuration diagram of the diagnostic device according to the fourth embodiment of the present invention.
Figure 15:
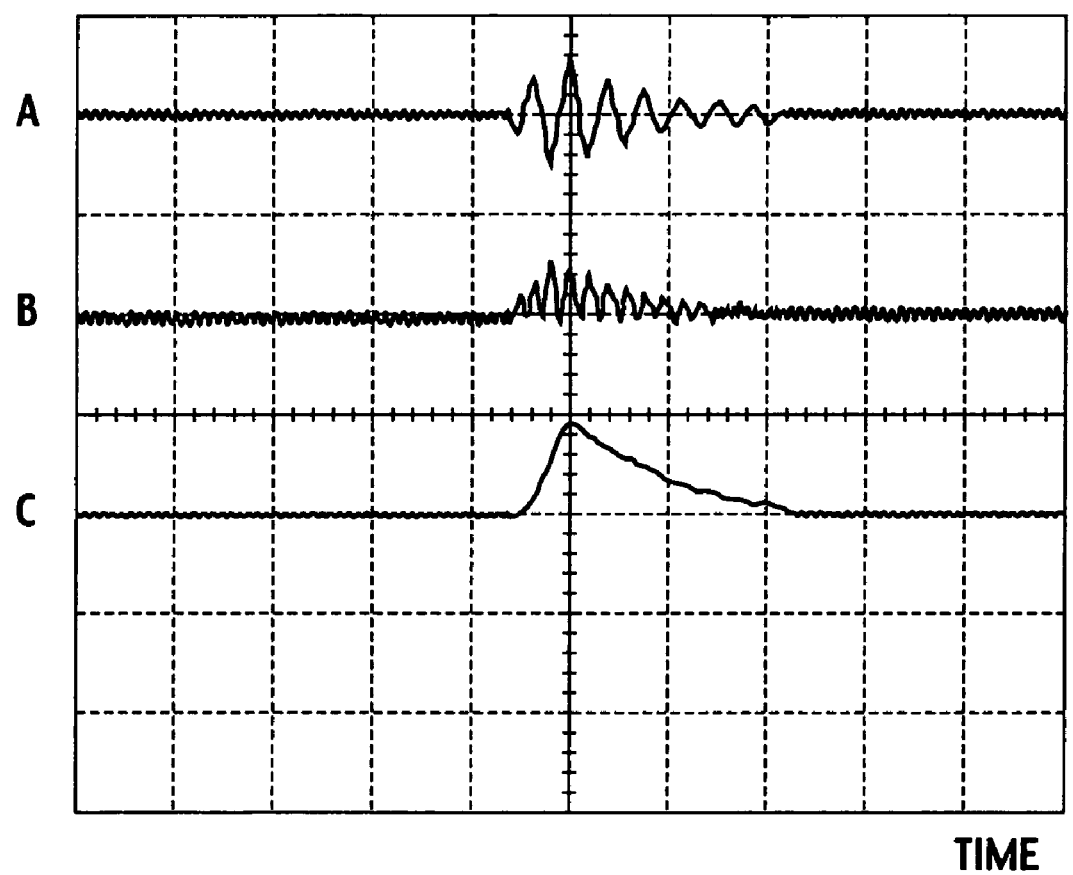
FIG. 15A is a diagram showing a signal waveform input to a first detector according to the fourth embodiment of the present invention.
FIG. 15B is a diagram showing a waveform of an input signal that has undergone full wave rectification in the first detector according to the fourth embodiment of the present invention.
FIG. 15C is a diagram showing a waveform of the full wave rectification signal smoothed in the first detector according to the fourth embodiment of the present invention.
Figure 16:
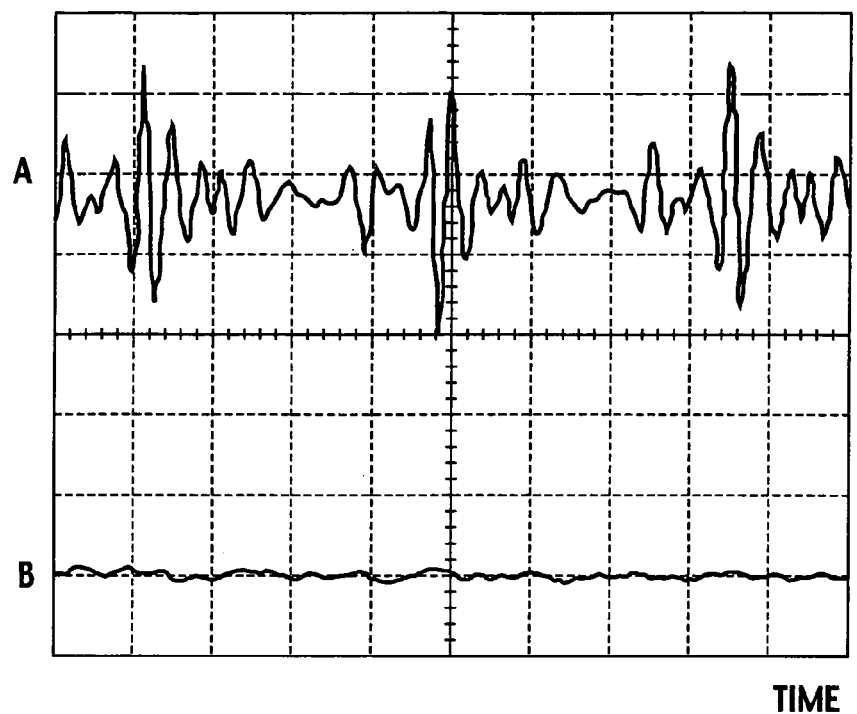
FIG. 16A is a diagram showing a noise current signal flowing through a cable in a state in which no partial discharge has occurred in the cable according to the fourth embodiment of the present invention.
FIG. 16B is a diagram showing an actually measured waveform of a combined signal in a state in which no partial discharge has occurred in the cable according to the fourth embodiment of the present invention.
Figure 17:
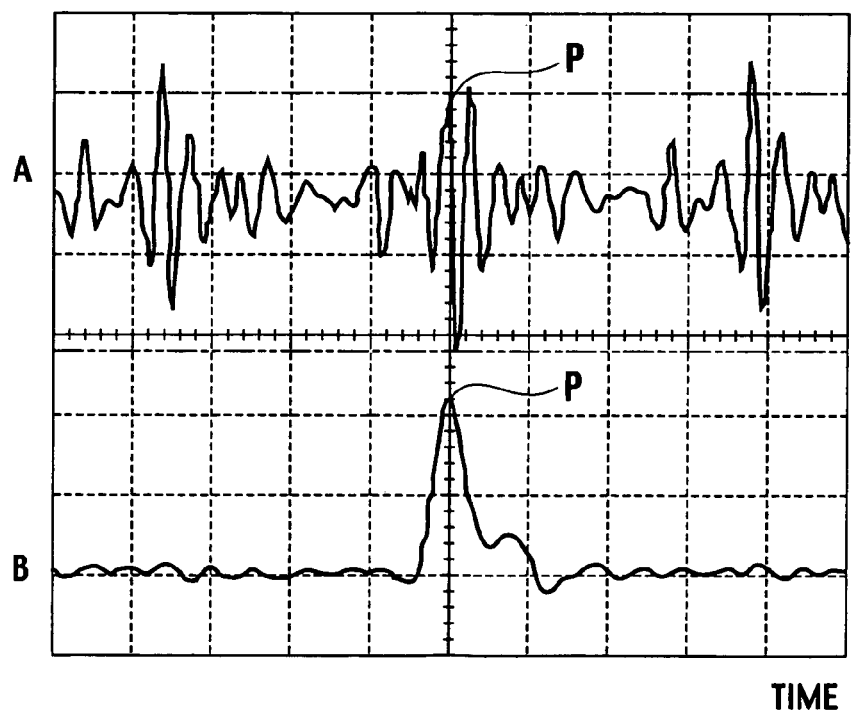
FIG. 17A is a diagram showing a noise-discharge current signal flowing through a cable in a state in which a partial discharge has occurred in the cable according to the fourth embodiment of the present invention.
FIG. 17B is a diagram showing an actually measured waveform of a combined signal in a state in which a partial discharge has occurred in the cable according to the fourth embodiment of the present invention.

As shown in FIG. 14, the diagnostic device 1d is composed of a first diagnostic section A, a second diagnostic section B, a noise removal section 40, a second discharge judgment section 50, and a final discharge judgment section

60. The cable 2*a* is an object to be measured and the cable 2*b* is used for taking in a noise signal.

The first diagnostic section A is connected to the grounding conductor 5*a* of the cable 2*a*, which is an object to be measured. The configuration and operation of the first diagnostic section A are the same as those of the diagnostic device 1*a*.

The second diagnostic section B is connected to the grounding conductor 5*b* of the cable 2*b* for taking in a noise signal. The configuration and operation of the second diagnostic section B are the same as those of the diagnostic device 1*a* excluding the discharge judgment section 30.

The noise removal section 40 includes a first detection section 41, a second detection section 42, a positive/negative inversion section 43, an amplifier 44, and a combination section 45.

The first detection section 41 has a first end portion connected to TP2 of the first diagnostic section A. The first detection section 41 performs an envelope detection of a current signal at the TP2 of the diagnostic section A. Specifically, first, a current signal at the TP2 of the first diagnostic section A is input to the first detection section 41 (refer to FIG. 15A). Next, the first detection section 41 performs full wave rectification of the input current signal and forms a full wave rectification signal (refer to FIG. 15B). Then, the full wave rectification signal is smoothed and the first detection signal is output (refer to FIG. 15C). The first detection section 41 outputs the first detection signal obtained by the envelope detection to the combination section 45.

The second detection section 42 has a first end portion connected to TP2 of the second diagnostic section B. The second detection section 42 performs envelope detection of a current signal at the TP2 of the second diagnostic section B. The operation of the envelope detection in the second detection section 42 is the same as that of the envelope detection in the first detection section 41. The second detection section 42 outputs the second detection signal obtained by the envelope detection to the positive/negative inversion section 43.

The positive/negative inversion section 43 generates an inverted signal by inverting the sign of the second detection signal output from the second detection section 42. Then, the positive/negative inversion section 43 outputs the inverted signal to the amplifier 44.

The amplifier 44 amplifies the inverted signal so that the level of the inverted signal is substantially the same as the level of the first detection signal. The amplified inversed signal is output to the combination section 45 as an inversion detection signal. Incidentally, it may also be possible to omit the amplifier 44 and amplify the first amplification signal from the low-pass filter 19 with the second amplifier 20 so that the level of the inverted signal is substantially the same as the level of the first detection signal.

The combination section 45 generates a combined signal by adding the first detection signal from the first detection section 41 and the inversion detection signal from the amplifier 44 to combine the two signals. Here, the combination method is not limited to addition and other arithmetic operations will do. Then, the combined signal is output to the second discharge judgment section 50.

A noise current signal and the combined signal are shown in FIG. 16A and FIG. 16B, respectively, in a state in which no partial discharge has occurred in the cable 2*a*. Here, the noise current signal has a noise waveform flowing through the cable 2*a*. Referring to FIG. 16A and FIG. 16B, the combination section 45 outputs a substantially flat combined signal by removing noises from the noise current signal of the cable 2*a*.

A noise-discharge current signal and the combined signal are shown in FIG. 17A and FIG. 17B, respectively, in a state in which a partial discharge has occurred in the cable 2*a*. The noise-discharge current signal has a waveform in which a discharge current signal caused by a partial discharge is overlapped with the noise current signal flowing through the cable 2*a*. Here, in FIG. 17A, the part caused by a discharge current corresponds to the peak P. Referring to FIG. 17A and FIG. 17B, in the combination section 45, the part caused by a discharge current has a large peak P and in other parts, noises are removed from the noise current signal of the cable 2*a* and a substantially flat combined signal is output.

The second discharge judgment section 50 has a first end portion connected to the second end portion of the noise removal section 40. The second discharge judgment section 50 judges whether or not a partial discharge has occurred in the cable 2*a* based on a combined signal. In the discharge judgment processing, first, the second discharge judgment section 50 samples a combined signal for, for example, 0.1 to 0.2 µs and converts it to a digital signal. The second discharge judgment section 50 performs discharge judgment processing on the digital signal. In the discharge judgment processing, the second discharge judgment section 50 judges whether or not the peak value of the combined signal is equal to or more than a predetermined value. When it is equal to or more than the predetermined value, it is judged that a partial discharge has occurred in the cable 2*a* and the information is output to the final discharge judgment section 60.

The final discharge judgment section 60 has a first end portion connected to the second end portion of the second discharge judgment section 50. When both the judgment result by the discharge judgment section 30 of the first diagnostic section A and the judgment result by the second discharge judgment section 50 are that a partial discharge has occurred in the cable 2*a*, the final discharge judgment section 60 output the information to the outside.

The diagnostic device 1*d* has the following advantageous features

In addition to the judgment result by the first diagnostic section A, noises are removed by the noise removal section 40 and only a waveform caused by a partial discharge is extracted and whether or not a partial discharge has occurred is judged in the second discharge judgment section 50. In the final discharge judgment section 60, whether or not a partial discharge has occurred in the cable 2*a*, the object to be measured, is finally judged using both the judgment results. Therefore, it is possible to improve the judgment accuracy of a partial discharge in the cable 2*a*.

In the present embodiment, when both the judgment result by the discharge judgment section 30 of the first diagnostic section A and the judgment result by the second discharge judgment section 50 are that a partial discharge has occurred in the cable 2*a*, the information is output to the outside. However, this is not limited and it may also be possible to judge that a partial discharge has occurred in the cable 2*a* using only the judgment result by the second discharge judgment section 50.

Figure 18:
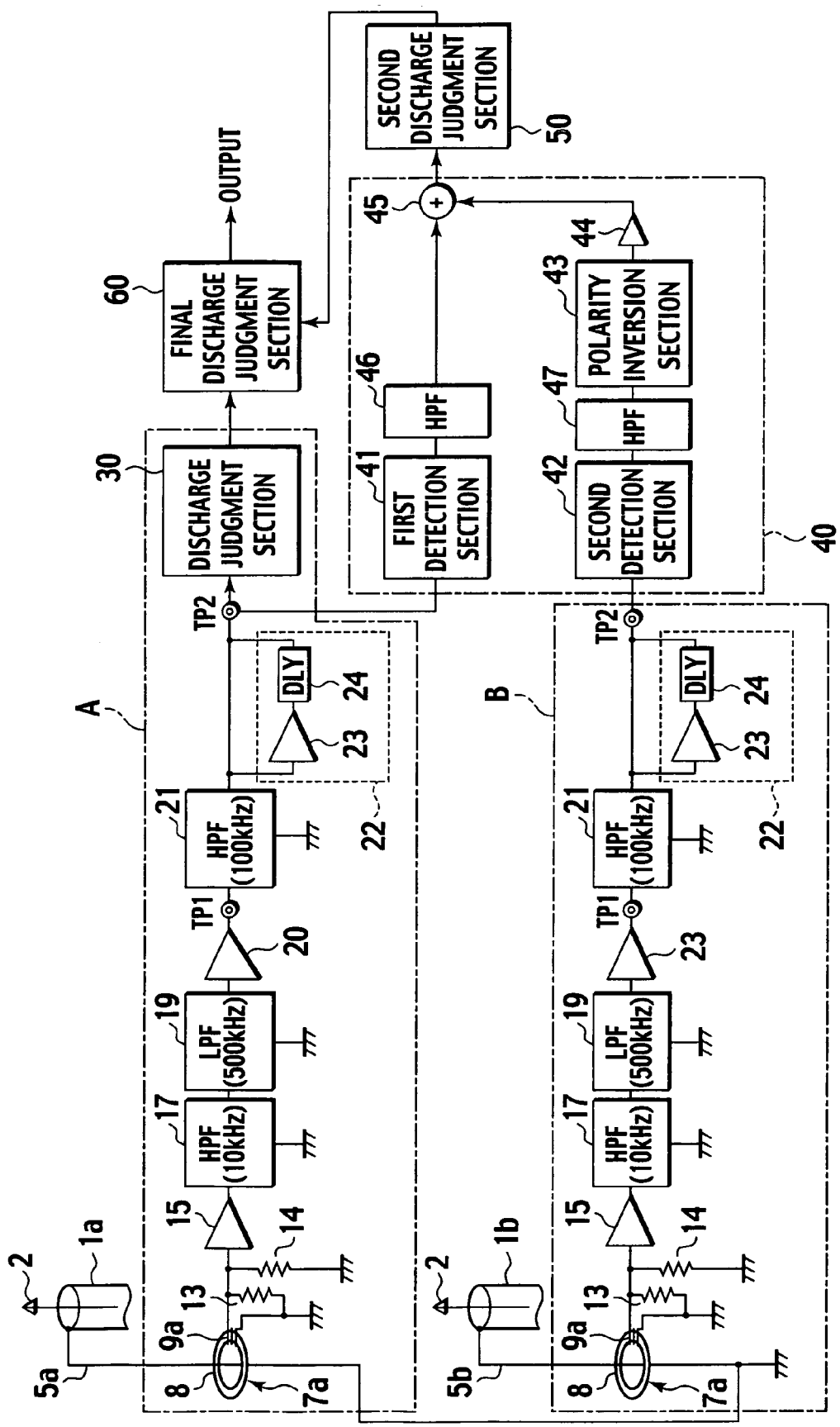
FIG. 18 is a configuration diagram of a diagnostic device according to a modification example of the fourth embodiment of the present invention.

As shown in FIG. 18, the noise removal section 40 can be modified so that a high-pass filter (HPF) 46 is provided between the first detection section 41 and the combination section 45 and a high-pass filter (HPF) 47 is provided between the second detection section 42 and the positive/negative inversion section 43. The cutoff frequencies of the high-pass filter 46 and the high-pass filter 47 each is set to a value that allows noises that appear in the detection signal as shown in FIG. 15C as a peak portion to pass through.

According to the configuration, it is possible to remove a low frequency component included in the first detection signal and the second detection signal. Therefore, the signal waveform other than the peak portions that appear in the first detection signal and the second detection signal becomes flat and if the first detection signal and the second detection signal are combined in the combination section 45, the waveform irregularities that occur in the combined signal caused by the low frequency component can be canceled. As a result, it is possible to more securely detect a current signal caused by a partial discharge.

Figure 19:
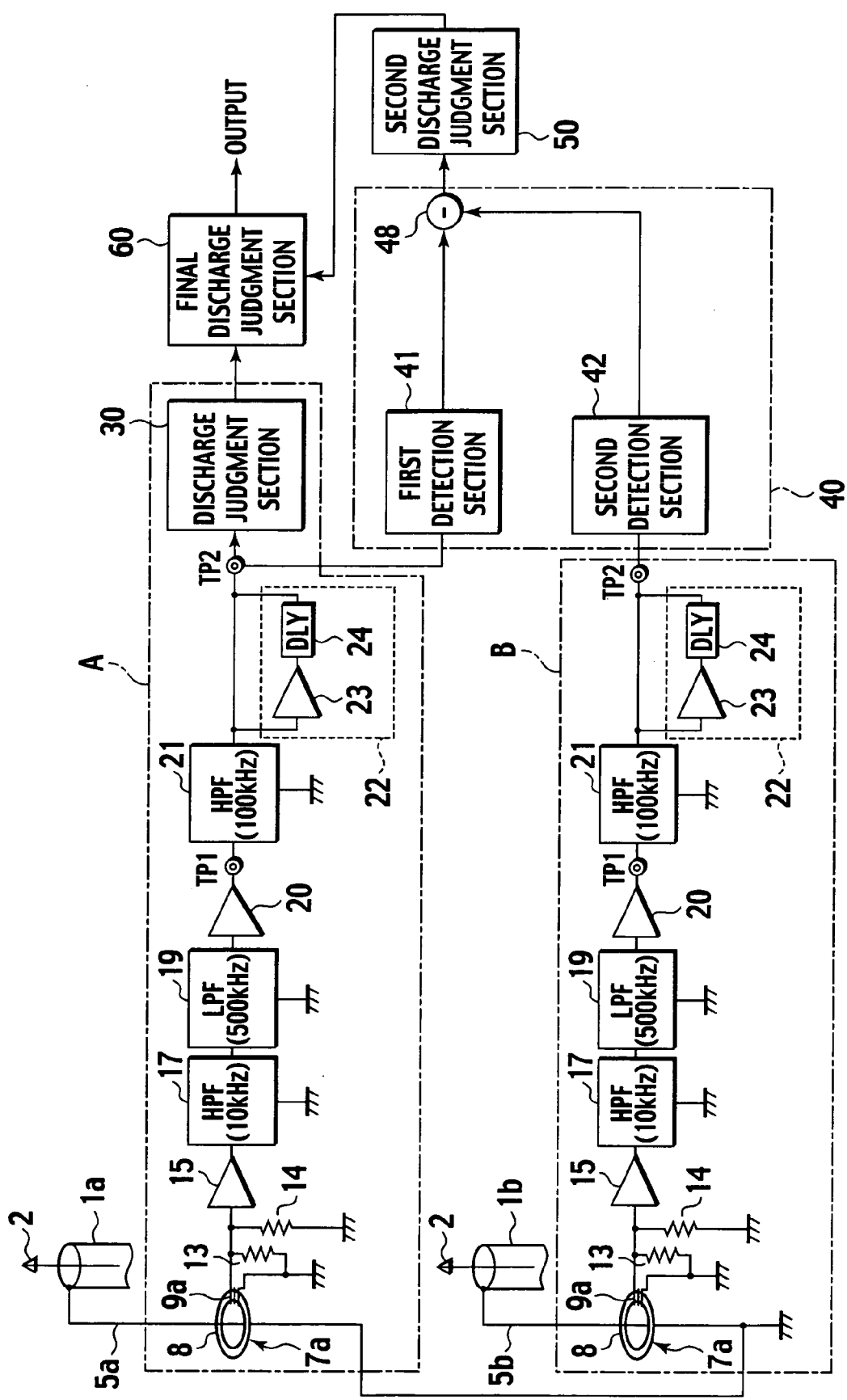
FIG. 19 is a configuration diagram of a diagnostic device according to another modification example of the fourth embodiment of the present invention.

Further, as shown in FIG. 19, the noise removal section 40 can be modified so that a subtraction circuit 48 is provided instead of the positive/negative inversion section 43, the amplifier 44, and the combination section 45. The subtraction circuit 48 calculates the difference between the first detection signal and the second detection signal and outputs the differential signal to the second discharge judgment section 50 as a combined signal. Other operation is the same as that of the diagnostic device 1d.

According to the configuration, the number of parts constituting the noise removal section 40 can be reduced, therefore, it is possible to configure the diagnostic device 1d easily and at a low cost.

In the present embodiment, an example in which diagnosis of insulation degradation is performed using the two single-core cables (cables 2a and 2b). However, this is not limited and it is possible to use various cables for diagnosis of insulation degradation, such as a multi-core cable, which is a multi-core covered with an insulator, and a triplex type cable composed of three twisted cores.

FIFTH EMBODIMENT

A diagnostic device 1e measures a partial discharge after removing (reducing) noises that have occurred on a cable by setting a low frequency band and a high frequency band.

Figure 20:
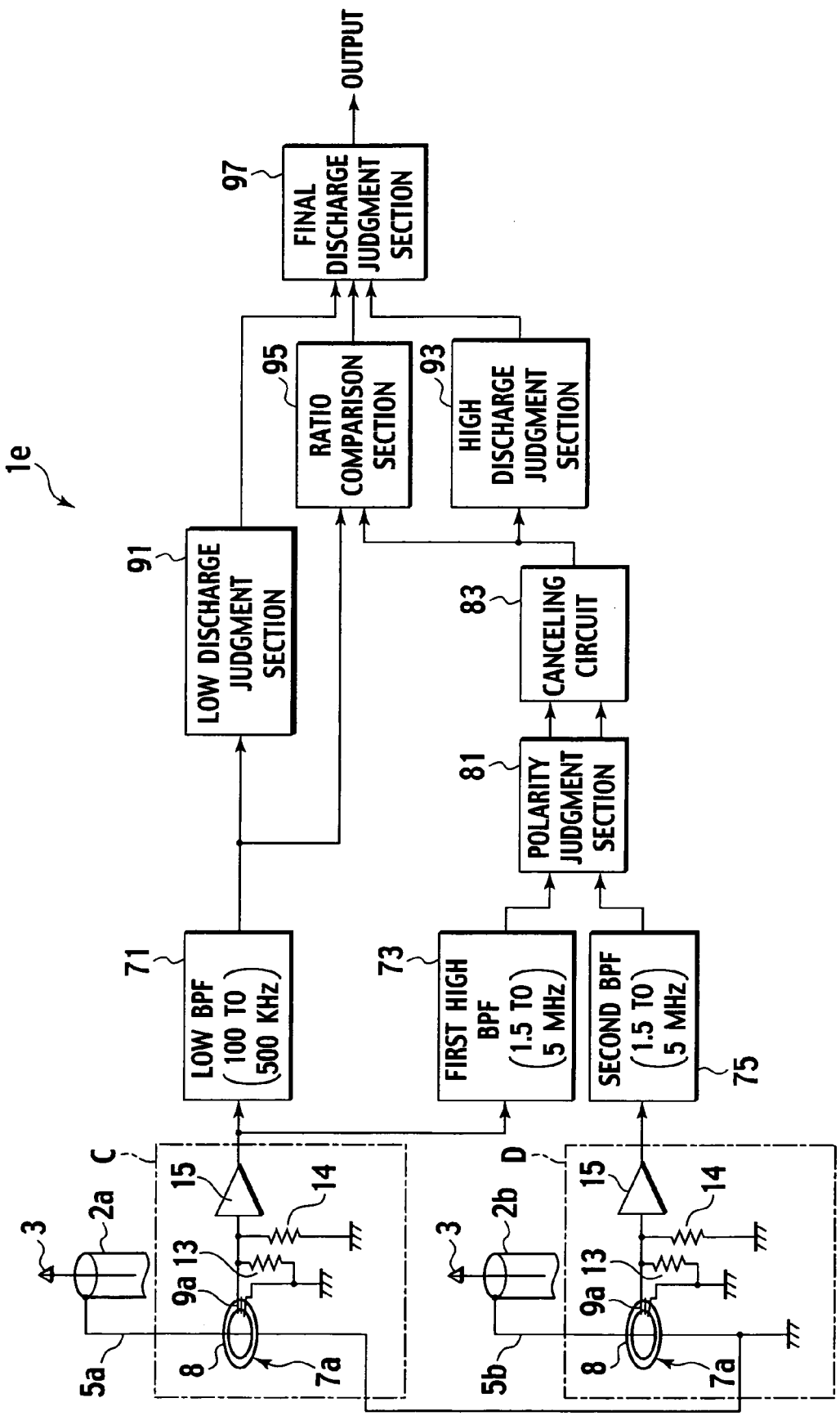
FIG. 20 is a configuration diagram of a diagnostic device according to a fifth embodiment of the present invention.
Figure 21:
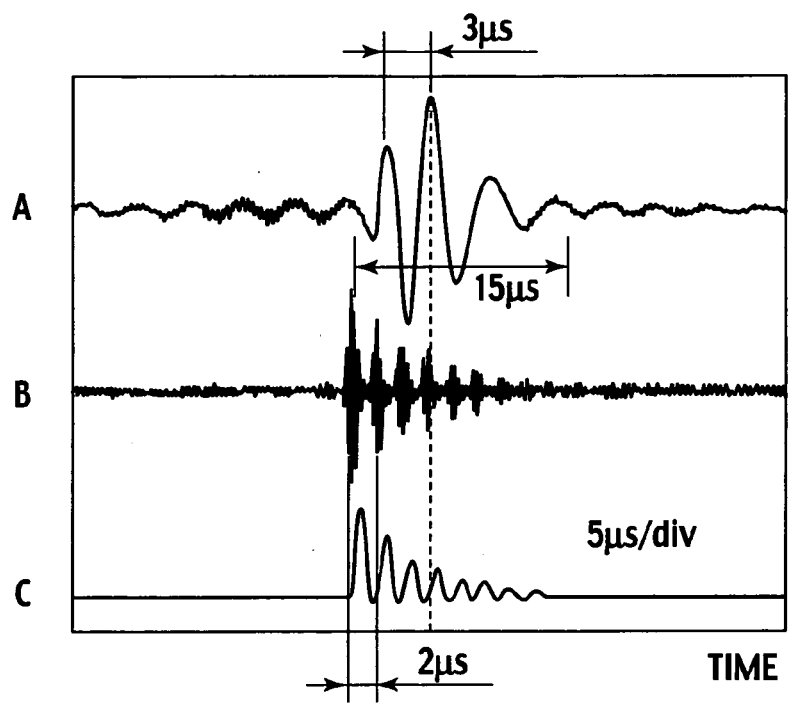
FIG. 21A is a diagram showing a waveform of a low frequency output signal in a state in which a partial discharge has occurred in a short cable according to the fifth embodiment of the present invention.
FIG. 21B is a diagram showing a waveform of a high frequency output signal in a state in which a partial discharge has occurred in the short cable according to the fifth embodiment of the present invention.
FIG. 21C is a diagram showing a waveform of a high frequency output signal detected and combined in a state in which a partial discharge has occurred in the short cable according to the fifth embodiment of the present invention.
Figure 22:
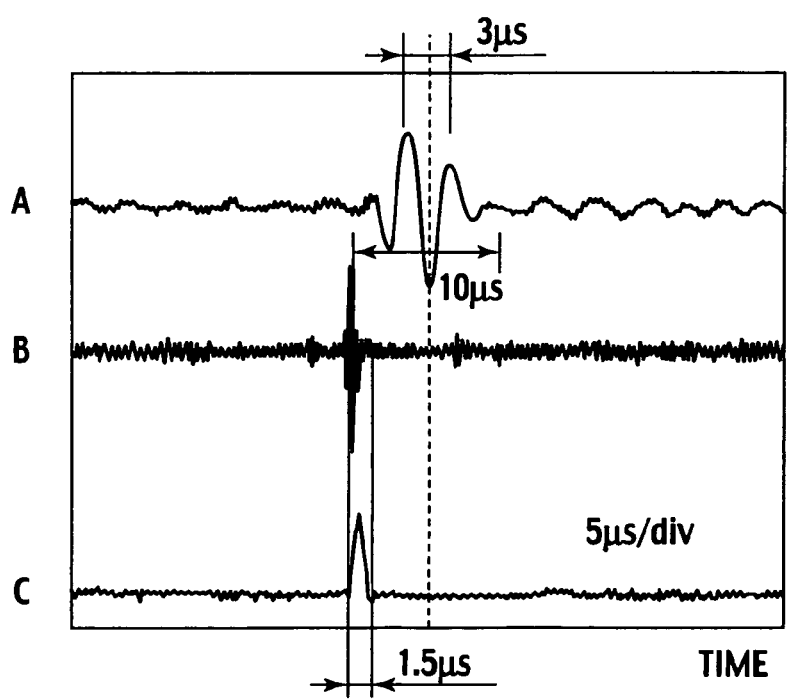
FIG. 22A is a diagram showing a waveform of a low output signal in a state in which a partial discharge has occurred in a long cable according to the fifth embodiment of the present invention.
FIG. 22B is a diagram showing a waveform of a high output signal in a state in which a partial discharge has occurred in the long cable according to the fifth embodiment of the present invention.
FIG. 22C is a diagram showing a waveform of a high output signal detected and combined in a state in which a partial discharge has occurred in the long cable according to the fifth embodiment of the present invention.
Figure 23:
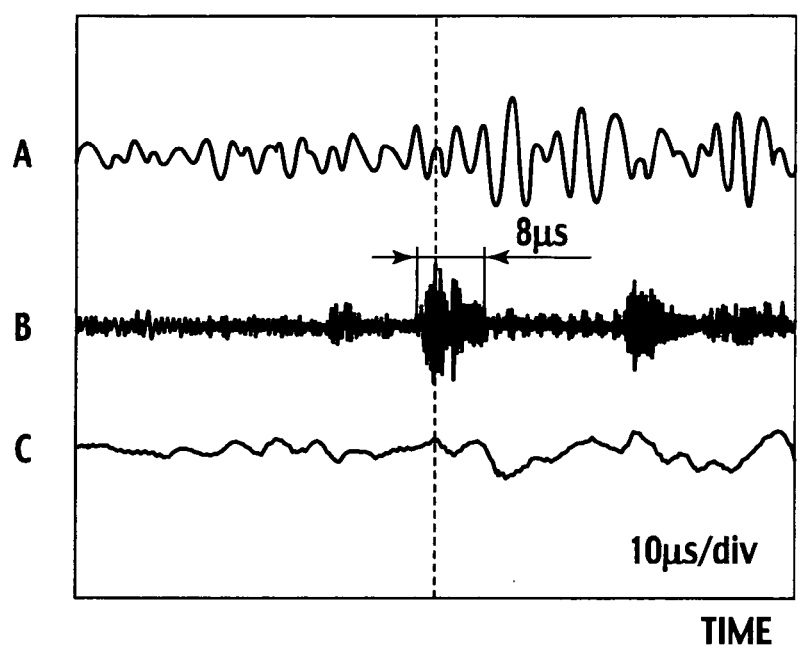
FIG. 23A is a diagram showing a noise waveform in a low frequency band in a state in which no partial discharge has occurred in the short cable according to the fifth embodiment of the present invention.
FIG. 23B is a diagram showing a noise waveform in a high frequency band in a state in which no partial discharge has occurred in the short cable according to the fifth embodiment of the present invention.
FIG. 23C is a diagram showing a noise waveform detected and combined in a high frequency band in a state in which no partial discharge has occurred in the short cable according to the fifth embodiment of the present invention.
Figure 24:
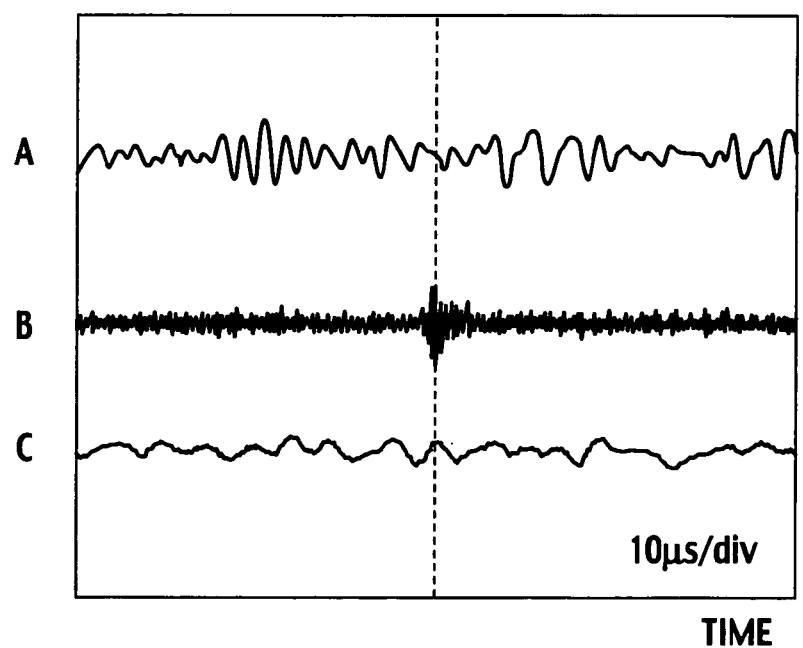
FIG. 24A is a diagram showing a noise waveform in a low frequency band in a state in which no partial discharge has occurred in the long cable according to the fifth embodiment of the present invention.
FIG. 24B is a diagram showing a noise waveform in a high frequency band in a state in which no partial discharge has occurred in the long cable according to the fifth embodiment of the present invention.
FIG. 24C is a diagram showing a noise waveform detected and combined in a high frequency band in a state in which no partial discharge has occurred in the long cable according to the fifth embodiment of the present invention.

As shown in FIG. 20, the diagnostic device 1e is composed of a first detection section C, a second detection section D, a low band pass filter (low BPF) 71, a first high band pass filter (first high BPF) 73, a second high band pass filter (second high BPF) 75, a polarity judgment section 81, a canceling circuit 83, a low frequency discharge judgment section 91, a high frequency discharge judgment section 93, a ratio comparison section 95, and a final discharge judgment section 97. The cable 2a is an object to be measured and the cable 2b is used for taking in a noise signal.

The first detection section C is connected to the grounding conductor 5a of the cable 2a, an object to be measured. The configuration and operation of the first detection section C are the same as those from the current transformer 7a to the amplifier 15 of the diagnostic device 1a.

The second detection section D is connected to the grounding conductor 5b of the cable 2b for taking in a noise signal. The configuration and operation of the second detection section D are the same as those of the first detection section C.

The low band pass filter 71 has a first end portion connected to the second end portion of the first amplifier 15 of the first detection section C. The low band pass filter 71 allows a frequency belonging to a low frequency band of 100 to 500 KHz to pass through.

The first high band pass filter 73 has a first end portion connected to the second end portion of the first amplifier 15 of the first detection section C. The first high band pass filter 73 allows a frequency belonging to a high frequency band of 1.5 to 5 MHz to pass through.

The second high band pass filter 75 has a first end portion connected to the second end portion of the first amplifier 15 of the second detection section D. The second high band pass filter 75 allows a frequency belonging to a high frequency band of 1.5 to 5 MHz to pass through.

The polarity judgment section 81 has a first end portion connected to the second end portion of the first high band pass filter 73 and the second end portion of the second high band pass filter 75. The polarity judgment section 81 judges whether or not the opposite polarity is possessed by comparing the polarity of a first signal from the cable 2a and the polarity of a second signal from the cable 2b.

When the grounding conductors 5a and 5b are connected to the common grounding bus line, if noises invade the grounding bus line through a certain point, a noise current having substantially the same waveform flows on the grounding conductors 5a and 5b from the grounding bus line toward the cable in the same direction. Therefore, when no partial discharge has occurred in the cable 2a, the polarity judgment section 81 judges that the two signals do not have opposite polarity and ends the diagnosis of insulation degradation. When a partial discharge occurs in the cable 2a, discharge current flows on the grounding conductor 5a in the direction opposite to the noise current, therefore, the polarity judgment section 81 judges that the two signals have opposite polarities.

The canceling circuit 83 has a first end portion connected to the second end portion of the polarity judgment section 81 and receives the first signal and the second signal. The canceling circuit 83 adds the first signal and the second signal and removes noise from the first signal.

The low frequency discharge judgment section 91 has a first end portion connected to the second end portion of the low band pass filter 71. The low frequency discharge judgment section 91 judges whether or not a partial discharge has occurred in the cable 2a by finding the p-p value, the p-p time, and the period for the low frequency output signal that has passed through the low band pass filter 71. Here, the period is a duration time of one wave having a peak.

As shown in FIG. 21A and FIG. 22A, when a partial discharge occurs in the cable 2a, the low frequency output signal exhibits the attenuated oscillation waveform that converges within 15 µs with both the short cable (150 m) and the long cable (1,630 m). In addition, the low frequency output signal has a period of 2 to 5 µs. Incidentally, the noise waveforms of the short cable and the long cable when no partial discharge occurs in the cable 2a exhibit waveforms as shown in FIG. 23A and FIG. 24A, respectively.

The high frequency discharge judgment section 93 has a first end portion connected to the second end portion of the canceling circuit 83. The high frequency discharge judgment section 93 judges whether or not a partial discharge has occurred in the cable 2a by finding the p-p value and the p-p time for the high frequency output signal that has passed through the canceling circuit 83.

As shown in FIG. 21B and FIG. 21C, when a partial discharge occurs in the cable 2a, the high frequency output signal exhibits an attenuated oscillation waveform in which reflected waves continue several times at an interval corresponding to the propagation speed of the pulse waveform of the discharge current in the short cable. The duration time (wavelength) of one wave is less than 2 µs. Further, as shown in FIG. 22B and FIG. 22C, in the long cable, the reflected waves rapidly attenuate and only one wave appears. The duration time (wavelength) of one wave is less than 2 µs. Incidentally, the noise waveforms of the short cable and the long cable when no partial discharge occurs in the cable 2a exhibit waveforms as shown in FIG. 23B (or FIG. 23C) and FIG. 24B (or FIG. 24C), respectively.

Figure 25:
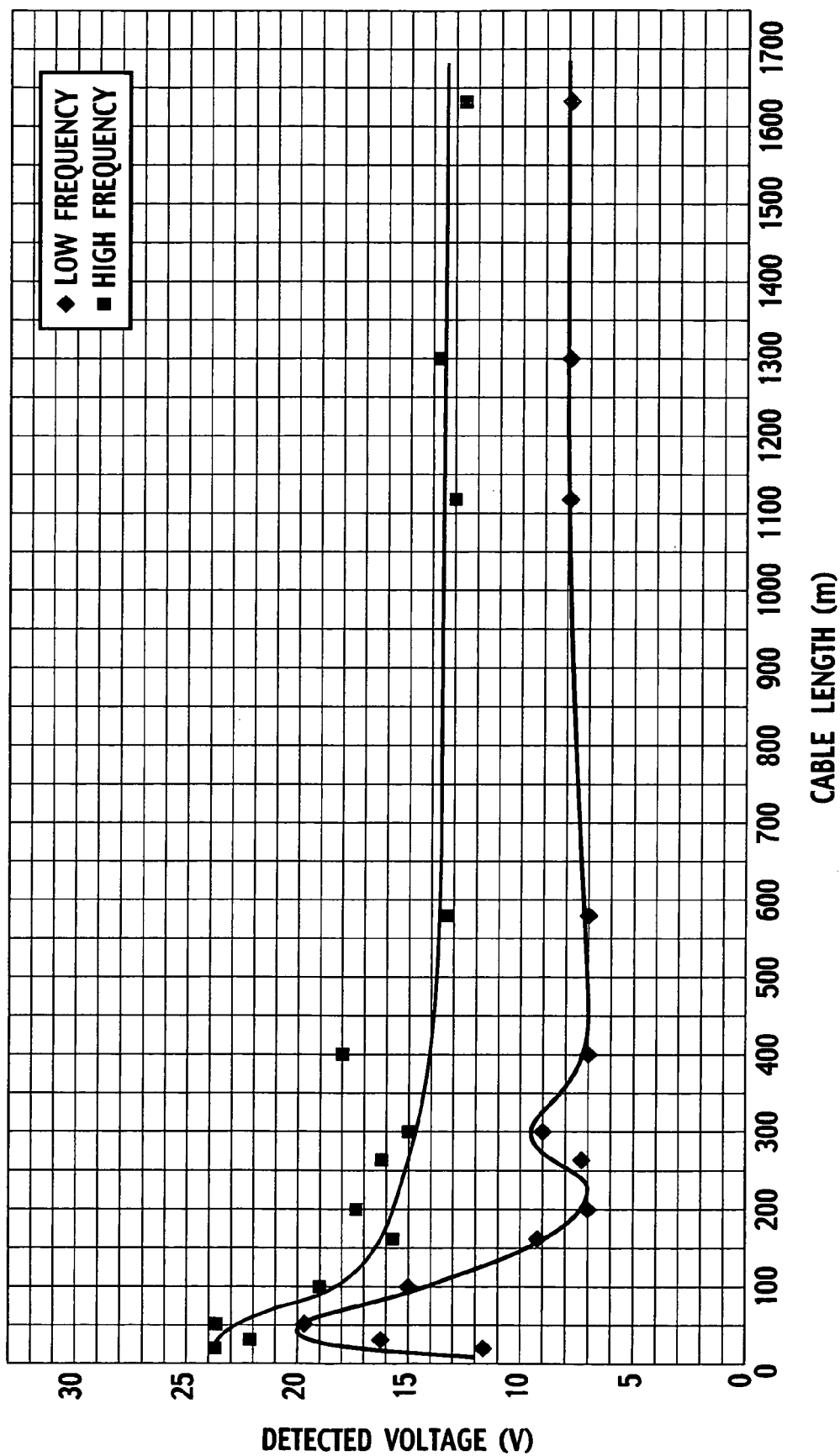
FIG. 25 is a diagram showing a relationship between the cable length and the low frequency output signal value, and between the cable length and the high frequency output signal value when a configuration pulse (an amount of charge of 100 pC) is injected into a cable $2a$ according to the fifth embodiment of the present invention.

The ratio comparison section 95 has a first end portion connected to the second end portion of the canceling circuit 83. The ratio comparison section 95 judges whether or not a partial discharge has occurred in the cable 2a by finding the ratio between the low frequency output signal that has passed through the low band pass filter and the high frequency output signal that has passed through the cancelling circuit 83. Specifically, as shown in FIG. 25, when the high frequency output signal value/the low frequency output signal value is in the range of 1.2 to 3.0, it is judged that a partial discharge has occurred in the cable 2a.

The final discharge judgment section 97 has a first end portion connected to the second end portion of the low frequency discharge judgment section 91, the second end portion of the high frequency discharge judgment section 93, and the second end portion of the ratio comparison section 95. When all of the judgment result by the low frequency discharge judgment section 91, the judgment result by the high frequency discharge judgment section 93, and the judgment result by the ratio comparison section 95 are that a partial discharge has occurred in the cable 2a, the final discharge judgment section 97 outputs the information to the outside.

The diagnostic device 1e has the following advantageous features.

Whether or not a partial discharge has occurred in the cable 2a is judged using the three judgment results by the low frequency discharge judgment section 91, the high frequency discharge judgment section 93, and the ratio comparison section 95 after a low frequency band and a high frequency band are set. Therefore, it is possible to improve the judgment accuracy of a partial discharge in the cable 2a.

It may also possible to set the low band pass filter 71 so as to allow a frequency belonging to a frequency band of 1.5 to 4 MHz to pass through and set the first and second high band pass filters 73 and 75 so as to allow a frequency belonging to a frequency band of 5 to 8 MHz to pass through.

INDUSTRIAL APPLICABILITY

A diagnostic device of the present invention can be applied to an insulation performance evaluation, an insulation diagnosis, and an insulation monitoring of the cable used in various apparatuses from high voltage to particularly high voltage. Further, the diagnostic device can be used for a characteristic evaluation test at the time of development, a production inspection on shipping, and an insulation diagnosis and monitoring of an apparatus in operation.

The invention claimed is:

1. An insulation degradation diagnostic device comprising:
   a current detector configured to have a filtering function with an amount of attenuation of −60 dB or less and a slope characteristic of −5 dB/oct or less at a commercial frequency, and detect a current flowing through a line to be measured;
   a first high-pass filter configured to remove a low frequency component from a current signal based on a current detected by the current detector;
   a low-pass filter configured to remove a high frequency component from a current signal from the first high-pass filter;
   an amplifier configured to amplify a current signal from the low-pass filter to a predetermined level;
   a second high-pass filter configured to extract a signal corresponding to a discharge current caused by a partial discharge that has occurred in the line to be measured, from a current signal amplified by the amplifier; and
   a discharge judgment section configured to judge whether or not a partial discharge has occurred in the line to be measured based on a signal extracted by the second high-pass filter.

2. The insulation degradation diagnostic device according to claim 1, wherein the current detector detects a current flowing through an output winding wound around a core through which the line to be measured is inserted.

3. The insulation degradation diagnostic device according to claim 1, further comprising a canceling amplifier configured to amplify a current signal from the amplifier,
   wherein an output winding and a tertiary winding are wound around a core through which the line to be measured is inserted and the current detector detects a current flowing through the output winding, and
   the canceling amplifier amplifies a current signal from the amplifier and outputs it to the tertiary winding so as to cancel a predetermined frequency component from the output of the output winding.

4. The insulation degradation diagnostic device according to claim 1, wherein the second high-pass filter has frequency characteristics that a cutoff frequency is 100 to 200 kHz and a slope characteristic is −18 dB/oct or less.

5. The insulation degradation diagnostic device according to claim 1, further comprising a delay circuit configured to invert and delay the output from the second high-pass filter,
   wherein a signal that is a combination of the output of the delay circuit and the output of the second high-pass filter is sent to the discharge judgment section.

6. The insulation degradation diagnostic device according to claim 1, wherein the discharge judgment section detects that a partial discharge has occurred in the line to be measured when the absolute value between the peak of the amplitude and the peak of an amplitude adjoining the amplitude of a signal from the second high-pass filter is within a predetermined range.

7. The insulation degradation diagnostic device according to claim 1, wherein the discharge judgment section detects that a partial discharge has occurred in the line to be measured when the time between the first peak and the last peak of a signal from the second high-pass filter is equal to or less than a predetermined time.

8. The insulation degradation diagnostic device according to claim 1, wherein the current detectors are provided to at least three lines to be measured and the discharge judgment sections are provided respectively to the current detectors.

9. The insulation degradation diagnostic device according to claim 8, further comprising a current direction judgment section configured to receive a current signal from each discharge judgment section,
   wherein the current direction judgment section judges, when the direction of one current signal out of at least three current signals is opposite to the direction of other current signals, that a partial discharge has occurred in the line to be measured corresponding to the one current signal.

10. The insulation degradation diagnostic device according to claim 1, further comprising:

a second current detector configured to have a filtering function with an amount of attenuation of −60 dB or less and a slope characteristic of −5 dB/oct or less at a commercial frequency, and detect a current flowing through another line connected to the line to be measured;

a third high-pass filter configured to remove a low frequency component from a current signal based on a current detected by the second current detector;

a second low-pass filter configured to remove a high frequency component from a current signal from the third high-pass filter;

a second amplifier configured to amplify a current signal from the second low-pass filter to a predetermined level;

a fourth high-pass filter configured to extract a signal corresponding to a discharge current caused by a partial discharge that has occurred in the another line, from a current signal amplified by the second amplifier;

a noise removal section configured to remove noises by obtaining the difference between a first detection signal, which is a signal from the second high-pass filter to which envelope detection has been performed, and a second detection signal, which is a signal from the fourth high-pass filter to which envelope detection has been performed;

a second discharge judgment section configured to judge whether or not a partial discharge has occurred in the line to be measured based on a signal from which noises have been removed in the noise removal section; and a final discharge judgment section configured to judge whether or not a partial discharge has occurred in the line to be measured based on the judgment result by the discharge judgment section and the judgment result by the second discharge judgment section.

11. The insulation degradation diagnostic device according to claim 10, wherein the first frequency band is 100 to 500 KHz and the second frequency band is 1.5 to 5 MHz.

12. The insulation degradation diagnostic device according to claim 10, wherein the first frequency band is 1.5 to 4 MHz and the second frequency band is 5 to 8 MHz.

13. An insulation degradation diagnostic device comprising:

a first current detector configured to have a filtering function with an amount of attenuation of −60 dB or less and a slope characteristic of −5 dB/oct or less at a commercial frequency, and detect a current flowing through a line to be measured;

a first amplifier configured to amplify a signal based on a current detected by the first current detector to a predetermined level;

a low band pass filter configured to allow a frequency component belonging to a first frequency band to pass through, from a signal amplified by the first amplifier;

a first high band pass filter configured to allow a frequency component belonging to a second frequency band to pass through, from a signal amplified by the first amplifier;

a low frequency discharge judgment section configured to judge whether or not a partial discharge has occurred in the line to be measured based on a first signal from the low band pass filter;

a second current detector configured to have a filtering function with an amount of attenuation of −60 dB or less and a slope characteristic of −5 dB/oct or less at a commercial frequency, and detect a current flowing through another line connected to the line to be measured;

a second amplifier configured to amplify a signal based on a current detected by the second current detector to a predetermined level;

a second high band pass filter configured to allow a frequency component belonging to a second frequency band to pass through, from a signal amplified by the second amplifier;

a polarity judgment section configured to judge whether or not the opposite polarity is possessed by comparing the polarity of a second signal from the first high band pass filter with the polarity of a third signal from the second high band pass filter;

a canceling circuit configured to remove noises from the second signal by applying an arithmetic operation to the second signal and the third signal;

a high frequency discharge judgment section configured to judge whether or not a partial discharge has occurred in the line to be measured based on a fourth signal from the canceling circuit;

a ratio comparison section configured to judge whether or not a partial discharge has occurred in the line to be measured based on a ratio between the first signal and the fourth signal; and a final discharge judgment section configured to finally judge whether or not a partial discharge has occurred in the line to be measured based on the judgment result by the low frequency discharge judgment section, the judgment result by the high frequency discharge judgment section, and the judgment result by the ratio comparison section.

* * * * *